US012641824B2

(12) United States Patent
Kawahara et al.

(10) Patent No.: US 12,641,824 B2
(45) Date of Patent: May 26, 2026

(54) SEMICONDUCTOR DEVICE WITH MOS TRANSISTORS EACH CONTAINING TRENCHES AND SCHOTTKY JUNCTIONS

(71) Applicant: Mitsubishi Electric Corporation, Tokyo (JP)

(72) Inventors: Kotaro Kawahara, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 777 days.

(21) Appl. No.: 17/918,116

(22) PCT Filed: May 29, 2020

(86) PCT No.: PCT/JP2020/021362
§ 371 (c)(1),
(2) Date: Oct. 11, 2022

(87) PCT Pub. No.: WO2021/240790
PCT Pub. Date: Dec. 2, 2021

(65) Prior Publication Data
US 2023/0139229 A1 May 4, 2023

(51) Int. Cl.
H10D 30/66 (2025.01)
H02P 27/06 (2006.01)
(Continued)

(52) U.S. Cl.
CPC ....... H10D 30/669 (2025.01); H10D 62/8325 (2025.01); H10D 84/146 (2025.01); H02P 27/06 (2013.01)

(58) Field of Classification Search
CPC .............. H10D 84/146; H10D 30/669; H10D 62/8325; H10D 8/60
See application file for complete search history.

(56) References Cited

U.S. PATENT DOCUMENTS

| | | | |
|---|---|---|---|
| 5,410,171 A | 4/1995 | Tsuzuki et al. | |
| 7,799,626 B2 * | 9/2010 | Pang .................. | H10D 30/0285 257/E21.32 |

(Continued)

FOREIGN PATENT DOCUMENTS

| | | |
|---|---|---|
| JP | 5-283705 A | 10/1993 |
| JP | 2016-21652 A | 2/2016 |

(Continued)

OTHER PUBLICATIONS

International Search Report and Written Opinion mailed on Sep. 1, 2020, received for PCT Application PCT/JP2020/021362, filed on May 29, 2020, 11 pages including English Translation.

(Continued)

*Primary Examiner* — Davienne N Monbleau
*Assistant Examiner* — Dmitri Mihaliov
(74) *Attorney, Agent, or Firm* — XSENSUS LLP

(57) ABSTRACT

A semiconductor device according to the present disclosure includes a sense source electrode provided separately from a source electrode, and diodes. The diodes are provided between the sense source electrode and a drift layer. A turn-on voltage of each diode is lower than an operating voltage of a p-n diode formed of a sense well region and the drift layer or of a dummy sense well region and the drift layer. The diodes allow a current to flow from the sense source electrode toward a drain electrode. The diodes are provided in such a way that they are mixed with facing areas in a dummy sense region in which dummy sense well regions and the diodes are disposed. Each facing area is an area where one of the dummy sense well regions faces one of the gate electrodes via one of the gate insulating films.

24 Claims, 20 Drawing Sheets

(51) Int. Cl.
    *H10D 62/832*      (2025.01)
    *H10D 84/00*      (2025.01)

(56)         References Cited

U.S. PATENT DOCUMENTS

| | | | |
|---|---|---|---|
| 2005/0174823 A1* | 8/2005 | Cao | H10D 30/665 |
| | | | 257/E29.066 |
| 2009/0189219 A1* | 7/2009 | Shinbori | H10D 64/117 |
| | | | 257/334 |
| 2014/0225114 A1 | 8/2014 | Furukawa et al. | |
| 2016/0011266 A1* | 1/2016 | Osanai | G01R 31/42 |
| | | | 324/762.01 |
| 2016/0079411 A1* | 3/2016 | Hino | H10D 84/146 |
| | | | 257/77 |
| 2017/0236935 A1* | 8/2017 | Ebihara | H10D 84/811 |
| | | | 257/77 |
| 2018/0061980 A1* | 3/2018 | Ohoka | H10D 30/669 |
| 2019/0371936 A1 | 12/2019 | Nagahisa et al. | |
| 2020/0295177 A1 | 9/2020 | Hino et al. | |

FOREIGN PATENT DOCUMENTS

| | | |
|---|---|---|
| JP | 2018-37577 A | 3/2018 |
| WO | 2013/042406 A1 | 3/2013 |
| WO | 2014/162969 A1 | 10/2014 |
| WO | 2016/052261 A1 | 4/2016 |
| WO | 2018/155566 A1 | 8/2018 |
| WO | 2019/124378 A1 | 6/2019 |

OTHER PUBLICATIONS

Office Action dated Jan. 15, 2026 in corresponding German patent application No. DE112020007266.5 (11 pages; with English translation).

* cited by examiner

SEMICONDUCTOR DEVICE WITH MOS TRANSISTORS EACH CONTAINING TRENCHES AND SCHOTTKY JUNCTIONS

CROSS-REFERENCE TO RELATED APPLICATION

The present application is based on PCT filing PCT/JP2020/021362, filed May 29, 2020, the entire contents of which is incorporated herein by reference.

TECHNICAL FIELD

The present disclosure relates to a semiconductor device and a power converter including the same.

BACKGROUND ART

Conventional semiconductor devices include a semiconductor device such as a vertical n-type channel silicon carbide Metal-Oxide-Semiconductor Field-Effect-Transistor (MOSFET) having a built-in current detection element. Such a semiconductor device has a source pad electrically connected to source regions of MOSFETs of a plurality of main cells provided below the source pad and has a sense pad electrically connected to source regions of MOSFETs of a plurality of sense cells provided below the sense pad. A sense peripheral well is formed so as to surround sense wells included in the MOSFETs of the sense cells in a plan view. A sense pad well is formed so as to surround the sense peripheral well in a plan view.

A plurality of n-type capacitor lower electrode regions are selectively formed on a surface of the sense peripheral well. A gate insulating film is formed above the sense peripheral well. Gate electrodes are partially formed above the gate insulating film. The MOSFETs include regions including the sense wells. The sense peripheral well, the capacitor lower electrode region, the gate insulating film, and the gate electrodes operate as a capacitor between the gate electrodes and the sense pad.

When detecting overcurrent by the sense cells, which are current detection elements, the conventional semiconductor device turns off the sense cells and the main cells to protect these cells. On the other hand, the sense cells are disposed less than the main cells to avoid loss of electrical efficiency. This results in a small transistor capacitance, which may cause a breakdown of the gate insulating film due to a surge voltage such as static electricity. The above-described sense peripheral well, capacitor lower electrode regions, gate insulating film, and gate electrodes provided in the conventional semiconductor device operate as a capacitor having a low input resistance in terms of alternating current. Thus, the number of cells is adjusted to increase the capacitance (i.e., electrostatic capacitance) of the capacitor, thereby relaxing an electric field at the gate insulating film when static electricity is applied and preventing dielectric breakdown (Patent Document 1, for example).

It is known that a semiconductor device such as a MOSFET includes a p-n diode, and crystal defects due to the operation of the p-n diode are easily generated, particularly in a semiconductor device of silicon carbide. To address this, in another conventional semiconductor device, a Schottky Barrier Diode (SBD) is formed by partially removing a wide-area well region near a sense cell, and a Schottky electrode is connected not to a source electrode but to a sense electrode. This suppresses the generation of crystal defects due to a p-n current in the sense cell. In addition, an SBD near a main cell and an SBD near a sense cell are formed in the wide-area well region and are connected to the source electrode and the sense electrode, respectively, thereby preventing the generation of crystal defects not only in the sense cell but also in the main cell (for example, Patent Document 2).

CITATION LIST

Patent Document

Patent Document 1: WO2013-042406 (paragraphs 0002, 0003, 0013 to 0029, 0060, and FIGS. 1 to 3)
Patent Document 2: WO2014-162969 (paragraphs 0004, 0005, 0147, 0151, 0152, FIGS. 15 and 17)

SUMMARY OF INVENTION

Technical Problem

In the semiconductor device described in Patent Document 1, a current flowing through a p-n diode formed of the sense peripheral well and the drift layer may expand crystal defects, increasing the device resistance at this portion to increase conduction loss. In particular, increasing an area of the sense peripheral well to obtain larger capacitance leads to device deterioration due to a current flowing through the p-n diode with high probability.

In Patent Document 2, there is a description of forming an SBD diode in the wide-area well region, which corresponds to the sense pad well in Patent Document 1, but a region corresponding to the sense peripheral well is not considered.

The present disclosure is made to solve the above-described problems, and an object thereof is to provide a semiconductor device capable of suppressing an increase in conduction loss due to expansion of crystal defects while ensuring a desired capacitance.

Solution to Problem

A semiconductor device according to the present disclosure is a device including a semiconductor layer having a first main surface and a second main surface opposite to the first main surface, a source electrode provided on a side of the first main surface, and a drain electrode provided on a side of the second main surface, and to control a current flowing between the source electrode and the drain electrode by a voltage applied to gate electrodes. The semiconductor device comprises: a sense source electrode provided separately from the source electrode and provided on the side of the first main surface of the semiconductor layer; a drift layer of a first conductivity type forming a main portion of the semiconductor layer; sense well regions of a second conductivity type selectively provided in a surface layer of the drift layer and electrically connected to the sense source electrode; sense source regions of the first conductivity type each selectively provided in a surface layer of each of the sense well regions and electrically connected to the sense source electrode; dummy sense well regions of the second conductivity type selectively provided in the surface layer of the drift layer separately from the sense well regions and electrically connected to the sense source electrode, and having no channel formed therein; gate insulating films provided between the dummy sense well regions and the gate electrodes; and diodes provided between the sense source electrode and the drift layer, each having a turn-on voltage lower than an operating voltage of a p-n diode formed of each of the sense well regions and the drift layer or of each of the dummy sense well regions and the drift layer, and allowing current to flow from the sense source electrode toward the drain electrode. The diodes are provided in such a way that they are mixed with facing areas in a dummy sense region in which the dummy sense well regions and the diodes are disposed, the facing areas each being an area in which one of the dummy sense well regions faces one of the gate electrodes via one of the gate insulating films.

Advantageous Effects of Invention

According to the present disclosure, in a dummy sense region in which dummy sense well regions and diodes are disposed, the diodes are provided in such a way that they are mixed with facing areas, each of which is an area in which a dummy sense well region faces a gate electrode via a gate insulating film. This suppresses an increase in conduction loss due to expansion of crystal defects while ensuring a desired capacitance in the dummy sense region, which improves the reliability of the semiconductor device.

BRIEF DESCRIPTION OF DRAWINGS

FIG. 2 is a schematic cross-sectional view of a main region of the semiconductor device according to Embodiment 1.

FIG. 11 is a diagram showing another example of the arrangement pattern of the sense region of the semiconductor device according to the variation of Embodiment 1.

FIG. 12 is a diagram showing another example of the arrangement pattern of the sense region of the semiconductor device according to the variation of Embodiment 1.

FIG. 13 is a schematic cross-sectional view of a sense region of a semiconductor device according to Embodiment 2.

FIG. 16 is a schematic cross-sectional view of a boundary region of a semiconductor device according to Embodiment 4.

FIG. 20 is a block diagram showing a power conversion system employing a power converter according to Embodiment 6.

DESCRIPTION OF EMBODIMENTS

Figure 1:
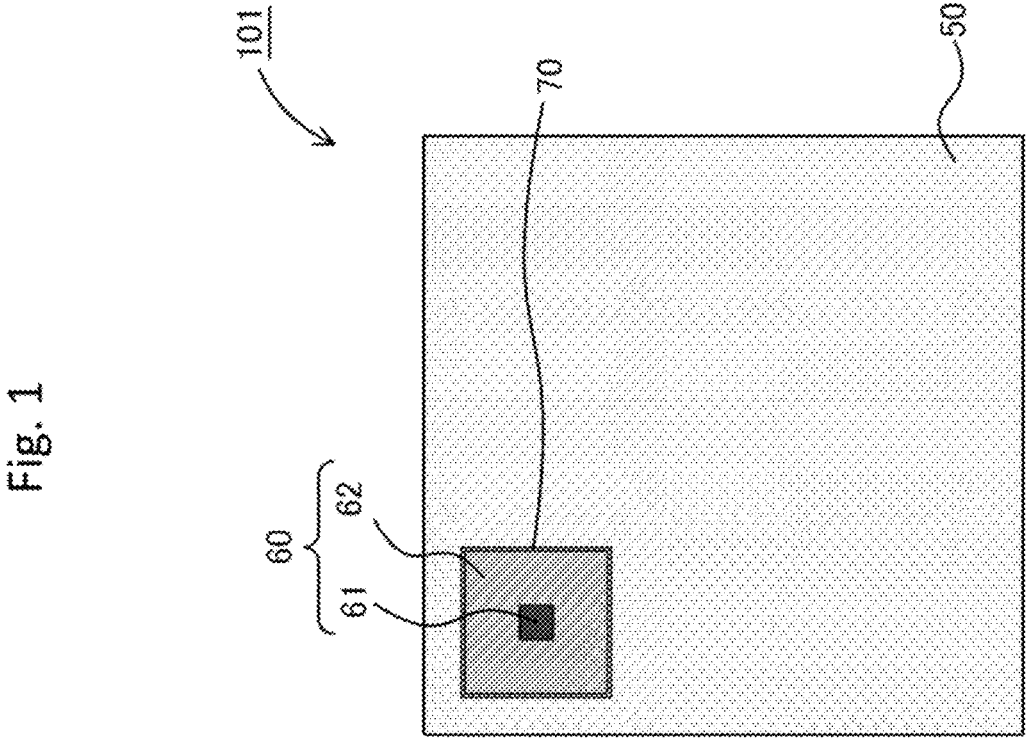
FIG. 1 is a schematic top view showing an entirety of a semiconductor device according to Embodiment 1.

Hereinafter, embodiments of the present disclosure will be described with reference to the accompanying drawings. Note that the drawings are schematically illustrated, and the mutual relationship between the sizes and positions of images illustrated in different drawings is not necessarily accurately described, and may be changed as appropriate. In the following description, similar components are denoted by the same reference numerals, and their names and functions are the same or similar. Therefore, a detailed description thereof may be omitted.

Broken lines in the drawings may be illustrated to indicate specific regions or boundaries between regions, but these are described for convenience of explanation or for easy understanding of the drawings, and do not limit the contents of the embodiments in any way.

Terms indicating specific positions and directions, such as "upper", "lower", "side", "bottom", "front", and "back", may be used in the following description. However, these terms are used for convenience to facilitate understanding of the contents of the embodiments, and are not related to the directions in actual implementation.

When a mutual relationship between components is expressed using terms such as "above/over" and "below/under" in the present disclosure, the existence of inclusions between the components is not prevented. For example, the expression "B provided above/over A" includes a case where another component C is provided between A and B and a case where no component is provided between them. When terms such as "above/over" and "below/under" are used in the present disclosure, they also include the concept of "upper" and "lower" with a laminated structure in mind. For example, the description "B provided above/over A covering a trench" means that B is present in a direction opposite to a trench surface viewed from A, including also a lateral direction and an oblique direction within the range of the meaning.

In the following description, a first conductivity type is n-type and a second conductivity type is p-type with respect to the conductivity type of impurities; however, the first conductivity type may be p-type and the second conductivity type may be n-type. A current flowing from a drain toward a source of a MOSFET is referred to as a forward current, and a current flowing from the source toward the drain is referred to as a freewheel current.

The term "MOS" has long been used for a junction structure of metal/oxide/semiconductor, and is an acronym of Metal-Oxide-Semiconductor. However, materials for a gate insulating film and a gate electrode of a field-effect transistor having a MOS structure (hereinafter, simply referred to as "MOS transistor"), in particular, have been improved in terms of recent improvements in integration and manufacturing processes.

For example, polycrystalline silicon instead of metal has been used as the material of the gate electrode in MOS transistors, mainly for self-aligned source-drain formation. To improve electrical characteristics, a material with a high dielectric constant is used as a material of the gate insulating film, but the material is not necessarily limited to oxides.

Therefore, the term "MOS" is not necessarily limited to laminated structures of metal/oxide/semiconductor, and such a limitation is not assumed in the description. That is, in view of common technical knowledge, the term "MOS" is not only an abbreviation derived from its origin, but also has broad meanings including laminated structures of conductor/insulator/semiconductor.

Embodiment 1

[Structure]

FIG. 1 is a schematic top view schematically showing an entirety of a semiconductor device 101 according to Embodiment 1 of the present disclosure. As shown in FIG. 1, the semiconductor device 101 according to Embodiment 1 includes a main region 50, a sense region 60, and a boundary region 70. The sense region 60 includes an active sense region 61 and a dummy sense region 62.

Figure 2:
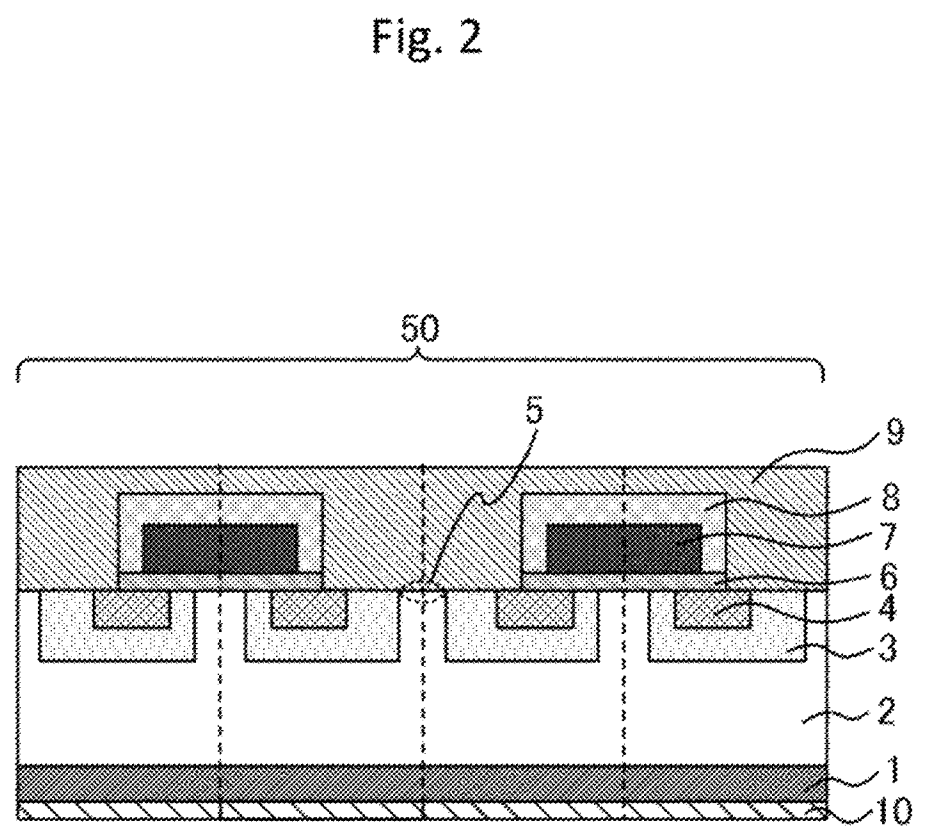

FIG. 2 is a schematic cross-sectional view showing a cross-section of a part of the main region 50. As shown in FIG. 2, the semiconductor device 101 includes, in the main region 50, a semiconductor substrate 1, a drift layer 2, well regions 3, source regions 4, Schottky junctions 5, gate insulating films 6, gate electrodes 7, interlayer insulating films 8, a source electrode 9, and a drain electrode 10. Hereinafter, a region formed of a semiconductor material including the semiconductor substrate 1, the drift layer 2, the well regions 3, and the source regions 4 may be referred to as a semiconductor layer.

The n-type drift layer 2 is provided over the n-type semiconductor substrate 1. The drift layer 2 occupies most of the semiconductor layer and constitutes a main part of the semiconductor layer. The p-type well regions 3 are selectively provided in a surface layer of the drift layer 2. An n-type source region 4 is selectively provided in a surface layer of each well region 3.

Each gate insulating film 6 is formed above well regions 3 and source regions 4 so as to face the well regions 3 and the source regions 4. A gate electrode 7 is formed partly over the gate insulating film 6. The gate electrode 7 is provided so as to face the well regions 3, the source regions 4, and the drift layer 2 via the gate insulating film 6.

In the main region 50, each interlayer insulating film 8 is provided above each gate electrode 7 so as to cover the gate electrode 7. The source electrode 9 (first main electrode) is provided above interlayer insulating films 8 so as to cover the interlayer insulating films 8. The source electrode 9 is electrically connected to the well regions 3, the source regions 4, and the drift layer 2 through contact holes formed in the interlayer insulating films 8. The source electrode 9 is ohmically connected to the well regions 3 and the source regions 4.

The drain electrode 10 (second main electrode) is provided on a surface of the semiconductor substrate 1 opposite to a surface on which the source electrode 9 is provided. The source electrode 9 is provided on a side of the front surface (first main surface) of the semiconductor layer (semiconductor substrate 1). The drain electrode 10 is provided on a side of the back surface (second main surface), which is opposite to the front surface of the semiconductor layer (semiconductor substrate 1).

The main region 50 has MOSFET structures. That is, when a positive voltage exceeding a certain value with respect to the source electrode 9 is applied to a gate electrode 7, a channel is formed in a region where a well region 3 above the drift layer 2 is in contact with the gate electrode 7 via a gate insulating film 6. This creates a conductive state between the source region 4 and the drift layer 2. As described above, the semiconductor device 101 controls the current flowing between the source electrode 9 and the drain electrode 10 by controlling the voltage applied to each gate electrode 7.

A plurality of unit cells, each of which is the smallest unit structure forming the above-described MOSFET structure, are disposed in the main region 50. The unit cells may be arranged in a stripe shape (comb shape) or may be arranged in a lattice shape.

The main region 50 has the Schottky junctions 5 provided between the source electrode 9 and the drift layer 2 at portions where the source electrode 9 and the drift layer 2 are in contact with each other. Each Schottky junction 5 forms a Schottky barrier diode (SBD). The SBD (second diode) is a diode whose turn-on voltage is lower than an operating voltage of a p-n diode formed of a well region 3 and the drift layer 2. The SBD is a unipolar diode, which allows current to flow in only one direction, allowing no forward current but only a freewheel current to flow. SBDs may be formed at a plurality of positions so as to be dispersed in the main region 50.

Figure 3:
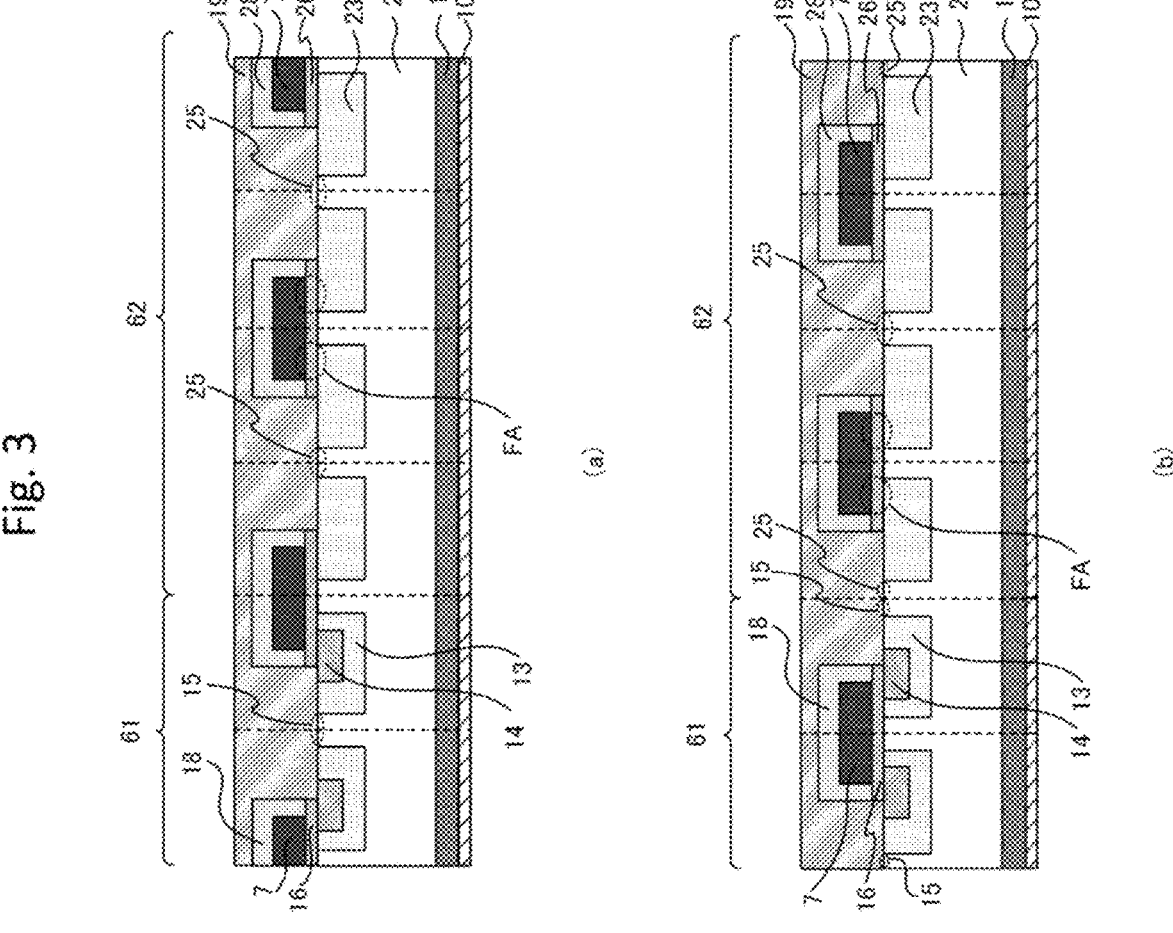
FIG. 3 shows schematic cross-sectional views of a sense region of the semiconductor device according to Embodiment 1.

FIG. 3(*a*) is a schematic cross-sectional view showing a cross-section of a part of the sense region 60. As shown in FIG. 3(*a*), the semiconductor device 101 includes in the active sense region 61 the semiconductor substrate 1, the drift layer 2, sense well regions 13, sense source regions 14, Schottky junctions 15, sense gate insulating films 16, the gate electrodes 7, sense interlayer insulating films 18, a sense source electrode 19, and the drain electrode 10. In the dummy sense region 62, the semiconductor substrate 1, the drift layer 2, dummy sense well regions 23, Schottky junctions 25, dummy sense gate insulating films 26, the gate electrodes 7, dummy sense interlayer insulating films 28, the sense source electrode 19, and the drain electrode 10 are disposed.

Hereinafter, the sense well regions 13 and the dummy sense well regions 23, including the well regions 3, may be referred to as each well region. The gate insulating films 6, the sense gate insulating films 16, and the dummy sense gate insulating films 26 may be collectively referred to as each gate insulating film. The interlayer insulating films 8, the sense interlayer insulating films 18, and the dummy sense interlayer insulating films 28 may be collectively referred to as each interlayer insulating film. The source electrode 9 and the sense source electrode 19 may be collectively referred to as each source electrode.

As shown in FIG. 3(*a*), the p-type sense well regions 13 (first semiconductor regions) are selectively provided in the surface layer of the drift layer 2 separately from the well regions 3. An n-type sense source region 14 (second semiconductor region) is selectively provided in a surface layer of each sense well region 13. The p-type dummy sense well regions 23 (third semiconductor region) are selectively provided in the surface layer of the drift layer 2 separately from the well regions 3 and the sense well regions 13. The sense well regions 13 are not divided by the dummy sense well regions 23 and are disposed in one block, that is, in one place in a plan view. The dummy sense well regions 23 are disposed on the periphery of the sense well regions 13 so as to sandwich or surround the sense well regions 13. The total area of the dummy sense well regions 23 is larger than that of the sense well regions 13 in a plan view.

A sense gate insulating film 16 is formed above the sense well regions 13 and the sense source regions 14 so as to face the sense well regions 13 and the sense source regions 14. A dummy sense gate insulating film 26 is formed above dummy sense well regions 23 so as to face the dummy sense well regions 23.

A gate electrode 7 is partially formed above a sense gate insulating film 16 and a dummy sense gate insulating film 26. In the active sense region 61, the gate electrode 7 is provided so as to face sense well regions 13, sense source regions 14, and the drift layer 2 via the sense gate insulating film 16. In the dummy sense region 62, the gate electrode 7 is provided so as to face dummy sense well regions 23 and the drift layer 2 via the dummy sense gate insulating film 26.

Note, that gate electrodes 7 are connected to each other in the main region 50, the sense region 60, and the boundary region 70. In other words, the gate electrodes 7 are connected to each other in a cross-section not shown in either FIG. 2 or FIG. 3(*a*).

The active sense region 61 has a sense interlayer insulating film 18 provided above a gate electrode 7 so as to cover the gate electrode 7. The dummy sense region 62 has a dummy sense interlayer insulating film 28 provided above a gate electrode 7 so as to cover the gate electrode 7.

The sense source electrode 19 (third main electrode) is provided on the sense interlayer insulating films 18 and the dummy sense interlayer insulating films 28 so as to cover these interlayer insulating films. The sense source electrode 19 is formed separately from the source electrode 9. Specifically, the sense source electrode 19 is formed physically separated from the source electrode 9. The total area of the sense source electrode 19 is smaller than that of the source electrode 9 in a plan view.

The sense source electrode 19 is electrically connected to the sense well regions 13, the sense source regions 14, the dummy sense well regions 23, and the drift layer 2 through contact holes formed in the sense interlayer insulating films 18 or the dummy sense interlayer insulating films 28. The sense source electrode 19 is ohmically connected to the sense well regions 13, the sense source regions 14, and the dummy sense well regions 23.

The dummy sense well regions 23 are not ohmically connected to the source electrode 9. Preferably, the dummy sense well regions 23 are not connected to the source electrode 9.

The drain electrode 10 is provided on a surface of the semiconductor substrate 1 opposite to a surface on which the sense source electrode 19 is provided. The sense source electrode 19 is provided on a side of the front surface (first main surface) of the semiconductor layer (semiconductor substrate 1). The drain electrode 10 is provided on a side of the back surface (second main surface), which is opposite to the front surface of the semiconductor layer (semiconductor substrate 1). The drain electrode 10 is provided so as to extend from the main region 50 through the sense region 60, that is, over the entire back surface of the semiconductor substrate 1.

The active sense region 61 has MOSFET structures. That is, when a positive voltage exceeding a certain value with respect to the sense source electrode 19 is applied to a gate electrode 7, a channel is formed in a region where a sense well region 13 contacts the gate electrode 7 via a sense gate insulating film 16. Thus, a sense source region 14 is electrically connected to the drift layer 2. On the other hand, in the dummy sense region 62, no source regions are formed in the dummy sense well regions 23. Therefore, even when a positive voltage exceeding a certain value with respect to the sense source electrode 19 is applied to a gate electrode 7, no path is formed for a current to flow from the drain electrode 10 to the sense source electrode 19 in the dummy sense region 62.

A plurality of unit cells, each of which is the smallest unit structure forming the above-described MOSFET structure, are disposed in the active sense region 61. A plurality of unit cells, each of which is the smallest unit structure including a dummy sense well region 23 and others, are disposed in the dummy sense region 62. The unit cells may be disposed in a stripe shape (comb shape) or may be disposed in a lattice shape.

The active sense region 61 has the Schottky junctions 15 provided between the sense source electrode 19 and the drift layer 2 at portions where the sense source electrode 19 and the drift layer 2 are in contact with each other. The dummy sense region 62 has the Schottky junctions 25 formed between the sense source electrode 19 and the drift layer 2 at portions where the sense source electrode 19 and the drift layer 2 are in contact with each other. A Schottky junction 15 or a Schottky junction 25 forms an SBD. The SBD is a diode whose turn-on voltage is lower than an operating voltage of a p-n diode formed of a sense well region 13 and the drift layer 2 or a dummy sense well region 23 and the drift layer 2. The SBD is a unipolar diode, which allows current to flow in only one direction, allowing no forward current but only a freewheel current to flow. SBDs may be formed at a plurality of positions so as to be dispersed in the sense region 60.

The Schottky junction 15 and the Schottky junction 25 are referred to separately according to the positions where they are formed for convenience, but have substantially the same configuration and function. Therefore, the Schottky junction 15 and the Schottky junction 25 may be collectively referred to as the Schottky junction 25, etc. The Schottky junction 15 or the Schottky junction 25 may be formed at a boundary between the active sense region 61 and the dummy sense region 62.

As shown in FIG. 3(*a*), the dummy sense region 62 includes a facing area FA, in which a dummy sense well region 23 faces a gate electrode 7 via a dummy sense gate insulating film 26. Schottky junctions 25 and facing areas FA are provided in such a way that they are mixed in the dummy sense region 62.

As shown in FIG. 1, the boundary region 70 is provided on the periphery of the sense region 60 so as to surround the sense region 60. The boundary region 70 is a region different from both the main region 50 and the sense region 60. Although not illustrated in either FIG. 2 or FIG. 3(*a*), the boundary region 70 includes a boundary well region 33 disposed in the surface layer of the drift layer 2.

The cross-section of the semiconductor device 101 is not limited to that shown in FIG. 3(*a*), and may be the structure shown in FIG. 3(*b*), for example.

Figure 4:
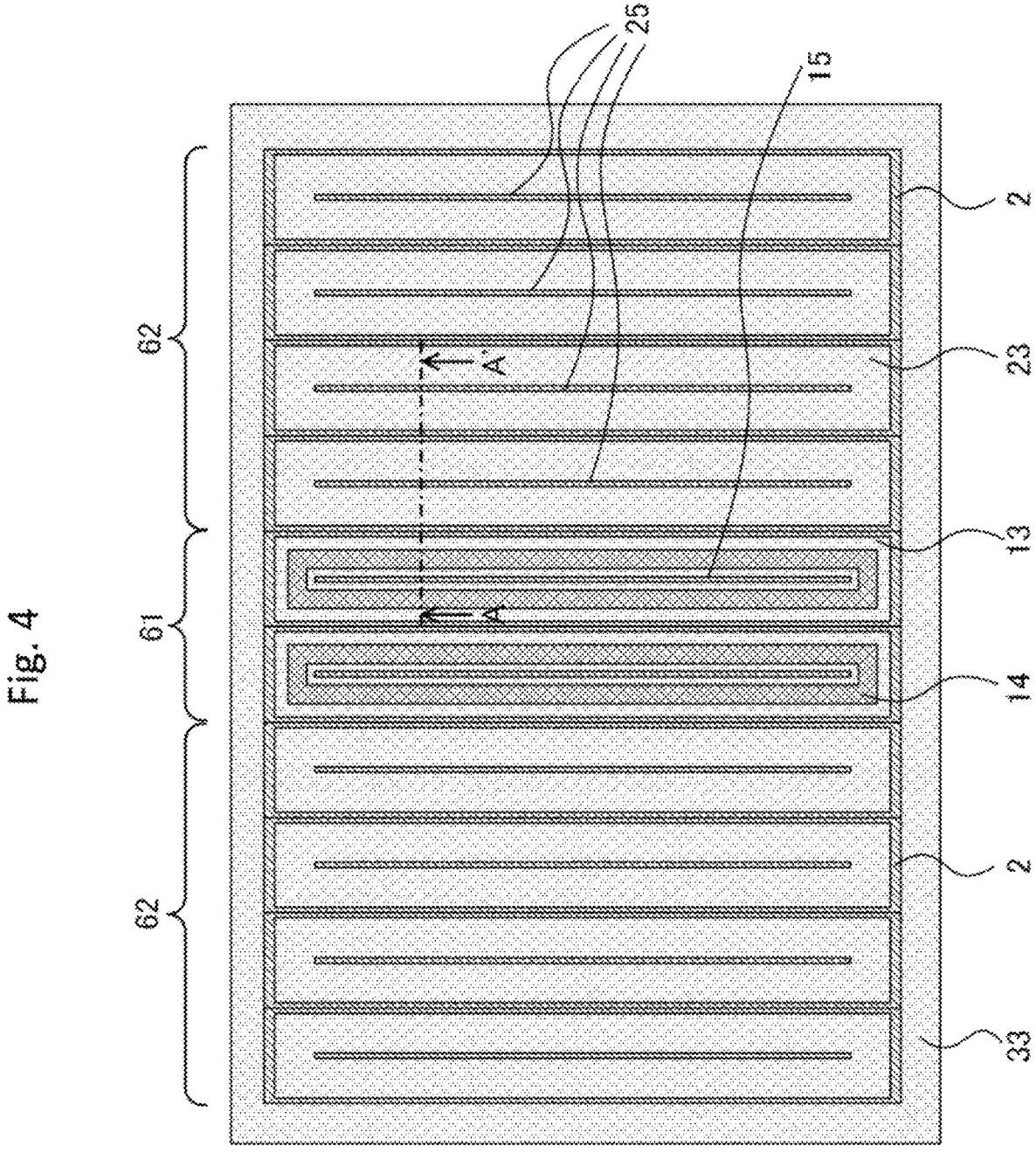
FIG. 4 is a diagram showing an example of an arrangement pattern of the sense region of the semiconductor device according to Embodiment 1.

FIG. 4 is an enlarged view of the sense region 60 and its periphery shown in FIG. 1, showing an exemplified arrangement pattern of each region in the sense region 60. FIG. 4 shows an upper surface of the semiconductor layer without each gate insulating film, the gate electrodes 7, each interlayer insulating film, and the sense source electrode 19 for simplicity. The cross-section A-A' in FIG. 4 corresponds to FIG. 3(*a*).

FIG. 4 shows a striped (comb-shaped) arrangement of the unit cells constituting the active sense region 61 and the dummy sense region 62. The active sense region 61 has a Schottky junction 15 surrounded by a sense well region 13 and a sense source region 14. The dummy sense region 62 has a Schottky junction 25 surrounded by a dummy sense well region 23.

Figure 5:
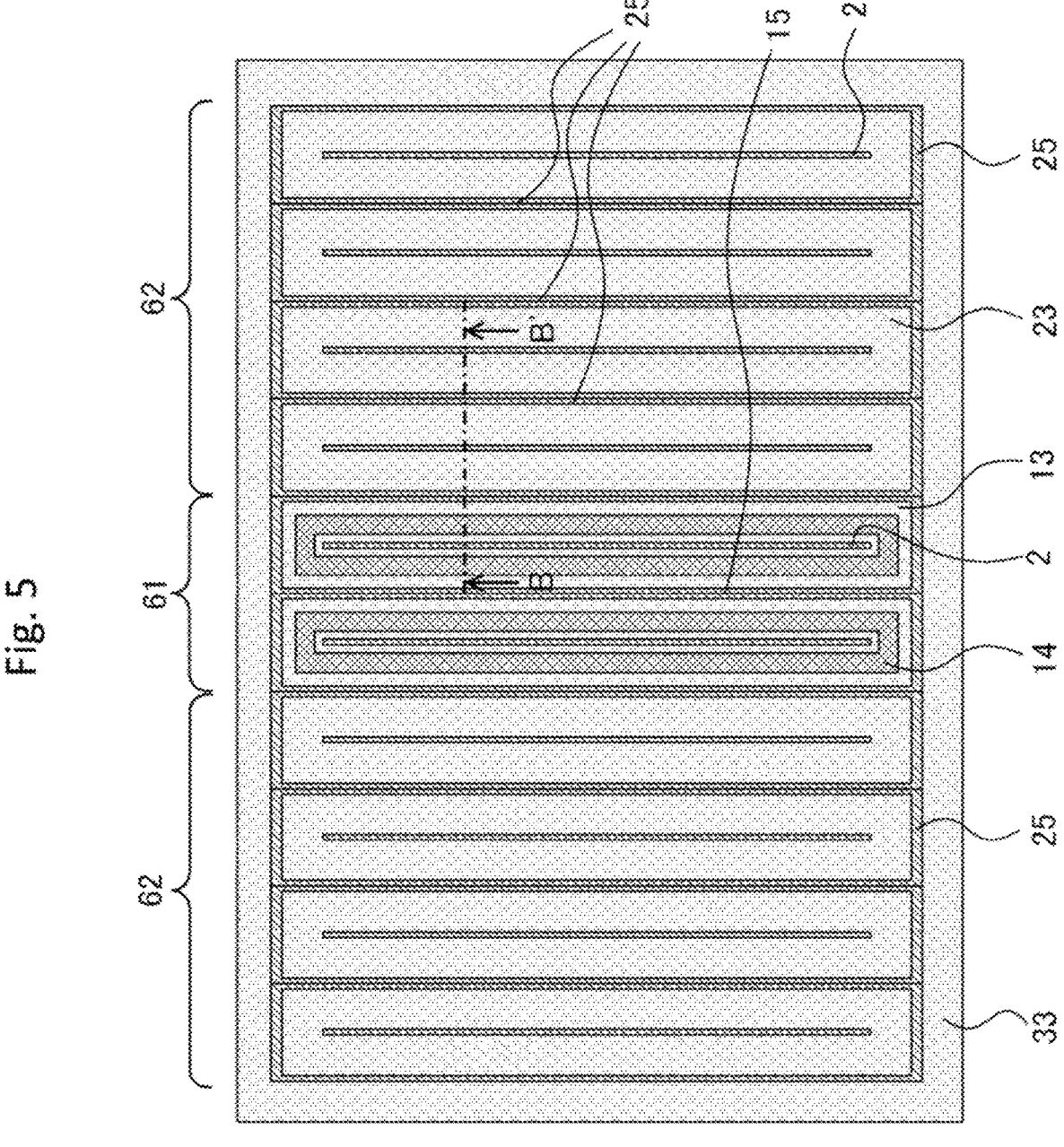
FIG. 5 is a diagram showing another example of the arrangement pattern of the sense region of the semiconductor device according to Embodiment 1.

FIG. 5 is an enlarged view of the sense region 60 and its periphery shown in FIG. 1, showing another exemplified arrangement pattern of each region in the sense region 60. FIG. 5 also shows an upper surface of the semiconductor layer without each gate insulating film, the gate electrodes 7, each interlayer insulating film, and the sense source electrode 19 for simplicity. The cross-section B-B' in FIG. 5 corresponds to FIG. 3(*b*).

Similar to FIG. 4, FIG. 5 shows a striped (comb-shaped) arrangement of the unit cells constituting the active sense region 61 and the dummy sense region 62. The active sense region 61 has, unlike FIG. 4, a sense well region 13 and a sense source region 14 surrounded by a Schottky junction 15. The dummy sense region 62 has a dummy sense well region 23 surrounded by a Schottky junction 25.

Figure 6:
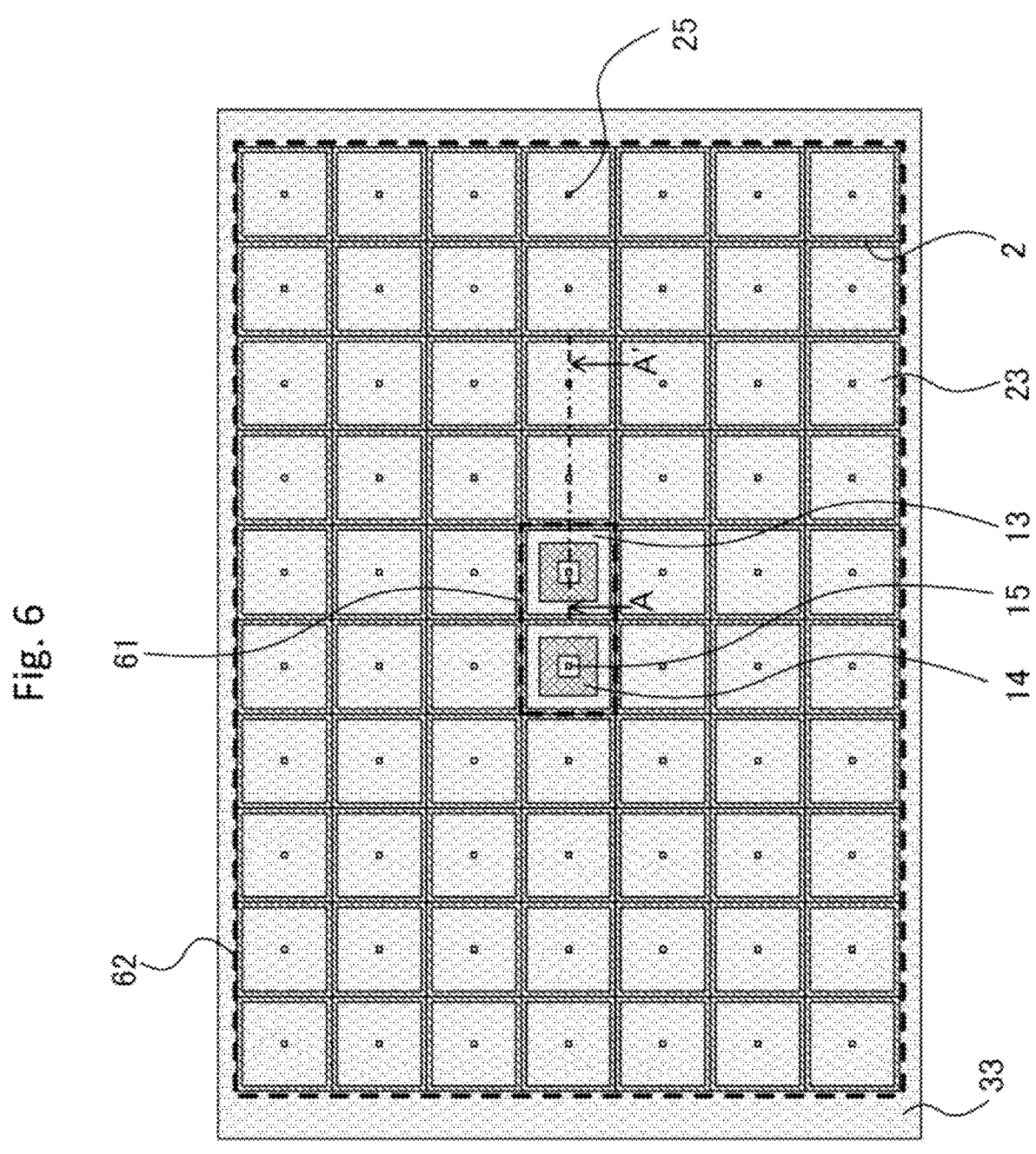
FIG. 6 is a diagram showing another example of the arrangement pattern of the sense region of the semiconductor device according to Embodiment 1.

FIG. 6 is an enlarged view of the sense region 60 and its periphery shown in FIG. 1, showing another exemplified arrangement pattern of each region in the sense region 60. FIG. 6 also shows an upper surface of the semiconductor layer without each gate insulating film, the gate electrodes 7, each interlayer insulating film, and the sense source electrode 19 for simplicity. The cross-section A-A' in FIG. 6 corresponds to FIG. 3(*a*).

FIG. 6 shows a lattice-shaped arrangement of the unit cells constituting the active sense region 61 and the dummy sense region 62. The active sense region 61 has a Schottky junction 15 surrounded by a sense well region 13 and a sense source region 14. The dummy sense region 62 has a Schottky junction 25 surrounded by a dummy sense well region 23.

Figure 7:
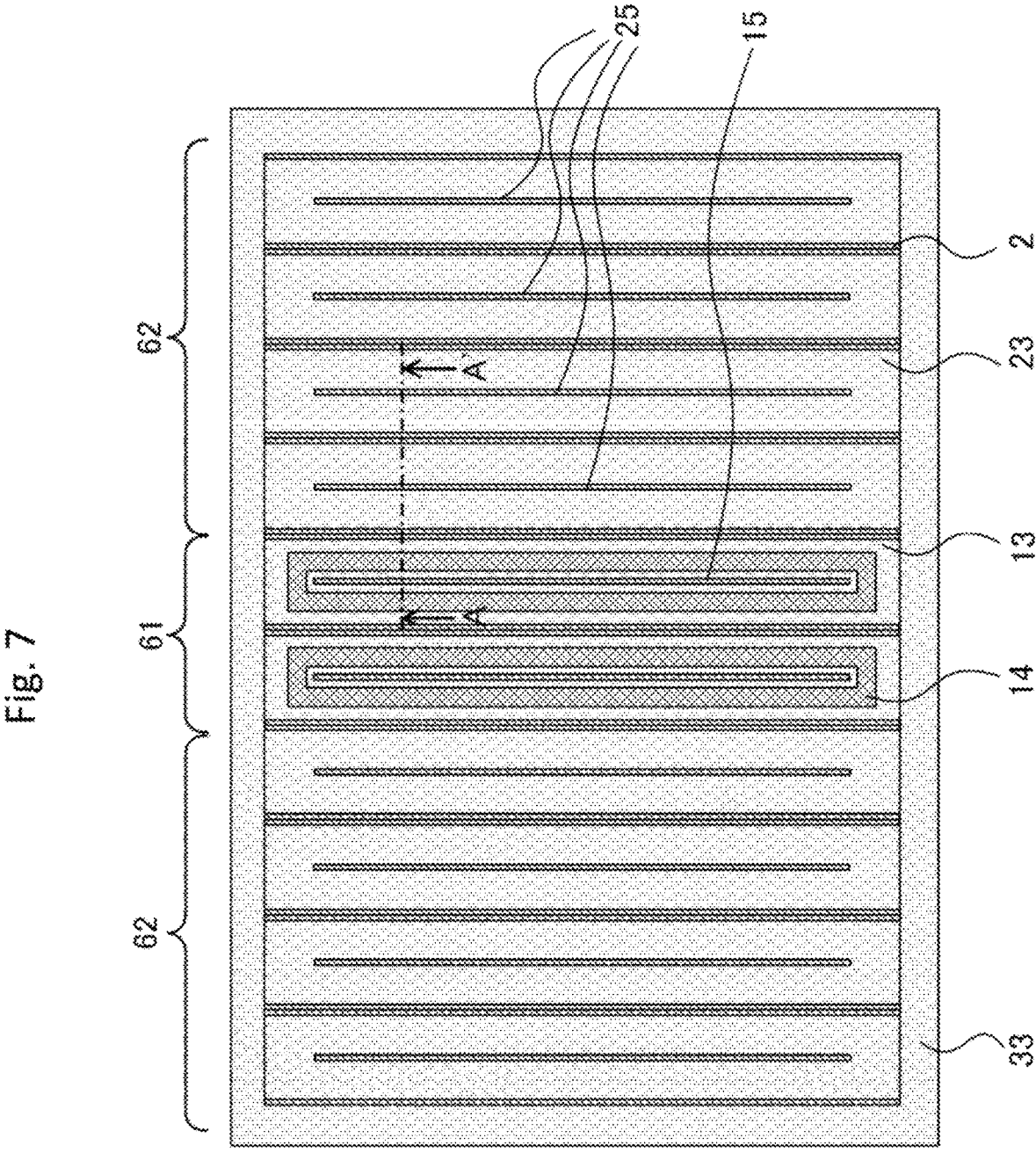
FIG. 7 is a diagram showing another example of the arrangement pattern of the sense region of the semiconductor device according to Embodiment 1.

FIG. 7 is an enlarged view of the sense region 60 and its periphery shown in FIG. 1, showing another exemplified arrangement pattern of each region in the sense region 60. FIG. 7 also shows an upper surface of the semiconductor layer without each gate insulating film, the gate electrodes 7, each interlayer insulating film, and the sense source electrode 19 for simplicity. The cross-section A-A' in FIG. 7 corresponds to FIG. 3(*a*).

The structure of the sense region 60 in FIG. 7 is almost the same as that shown in FIG. 4. The following point is different from FIG. 4. In FIGS. 4 to 6, the sense well regions 13 and the dummy sense well regions 23 of the sense region 60 are separated from the boundary well region 33 of the boundary region 70. In FIG. 7, however, the sense well regions 13 and the dummy sense well regions 23 of the sense region 60 are connected to the boundary well region 33 of the boundary region 70.

In FIGS. 4 to 7, Schottky junctions 25 are periodically provided in the dummy sense region 62. In FIGS. 4, 6, and 7, the Schottky junctions 25 are provided at a plurality of positions so as to be dispersed in the dummy sense region 62.

As shown in FIG. 3, a gate electrode 7 is formed on dummy sense well regions 23. Thus, as shown in FIGS. 4 to 7, facing areas FA shown in FIG. 3 and the Schottky junctions 25 are provided alternately and repeatedly in a plan view. Preferably, the Schottky junctions 25 in the dummy sense region 62 are provided alternately and repeatedly from the boundary region 70 toward the active sense region 61.

The Schottky junctions 25 are disposed in the dummy sense region 62 in such a way that the interval between them is no more than twice the arrangement interval between the Schottky junctions 5 in the main region 50.

Preferably, the Schottky junctions 25 are disposed at intervals of 1 μm to 100 μm in the dummy sense region 62.

Any arrangement pattern shown FIGS. 4 to 7 may be applicable to each region in the sense region 60 of the semiconductor device 101. Since FIGS. 4 to 7 are merely examples, the arrangement patterns are not limited to those shown in FIGS. 4 to 7, and may be other arrangement patterns similar to those.

The semiconductor substrate 1, the drift layer 2, the well region 3, the source region 4, the sense well region 13, the sense source region 14, and the dummy sense well region 23 are formed of silicon carbide (SiC). Silicon dioxide (SiO2), for example, may be used as the material of the gate insulating film 6, the interlayer insulating film 8, the sense gate insulating film 16, the sense interlayer insulating film 18, the dummy sense gate insulating film 26, and the dummy sense interlayer insulating film 28. Polysilicon can be used as the material of the gate electrode 7, for example. Nickel, titanium, aluminum, gold, platinum, copper, molybdenum, and alloys thereof can be used as materials of the source electrode 9, the sense source electrode 19, and the drain electrode 10.

[Method of Manufacturing]

A method of manufacturing the semiconductor device 101 will be described. First, a substrate having the semiconductor substrate 1 and the drift layer 2 epitaxially grown on the upper surface of the semiconductor substrate 1 is prepared. The n-type impurity concentration of the drift layer 2 is lower than that of the semiconductor substrate 1. The thickness and the impurity concentration of the drift layer 2 are set arbitrarily in accordance with the designed breakdown voltage of the semiconductor device 101. The drift layer 2 may have a thickness of 1 μm to 200 μm and an impurity concentration of $1.0\times10^{14}$ cm$^{-3}$ to $1.0\times10^{16}$ μcm$^{-3}$, for example.

Next, impurity (dopant) ions are implanted into the surface of the drift layer 2 by using implantation masks (for example, photoresists or silicon oxide films) patterned by photolithography. This forms the well region 3, the sense well region 13, and the dummy sense well region 23, which are of p-type, and the source region 4 and the sense source region 14, which are of n-type. The order of ion implantation for forming each region is arbitrary.

The thickness and the impurity concentration of each region can be set as follows, for example. The thicknesses of the well region 3, the sense well region 13, and the dummy sense well region 23 may be 0.1 μm to 2 μm, for example. The p-type impurity concentration of these regions is higher than the n-type impurity concentration of the drift layer 2, and the maximum impurity concentration thereof may be $1.0\times10^{15}$ cm$^{-3}$ to $1.0\times10^{19}$ cm$^{-3}$, for example.

The thickness of the source region 4 is set to be smaller than that of the well region 3. The thickness of the sense source region 14 is set to be smaller than that of the sense well region 13. The thicknesses of the source region 4 and the sense source region 14 may be 0.05 μm to 1 μm, for example. The n-type impurity concentration of the source region 4 is higher than the p-type impurity concentration of the well region 3. The n-type impurity concentration of the sense source region 14 is higher than the p-type impurity concentration of the sense well region 13. The maximum impurity concentration of the source region 4 and the sense source region 14 may be $1.0 \times 10^{16}$ cm$^{-3}$ to $1.0 \times 10^{20}$ cm$^{-3}$, for example.

After the above-described ion implantation, heat treatment (referred to as activation annealing) of the substrate is performed to electrically activate the impurities implanted into the drift layer 2.

Next, an insulating film to be the gate insulating film 6, the sense gate insulating film 16, and the dummy sense gate insulating film 26 is formed on the upper surface of the semiconductor layer by using a thermal oxidation method or a deposition method, for example. Subsequently, treatments such as high-temperature heat treatment, nitriding treatment, and oxidation treatment may be performed. These treatments improve the characteristics of each gate insulating film and the characteristics of an interface between each well region and each gate insulating film, in which a channel is formed.

A conductive layer, such as polysilicon, is deposited above the insulating films formed as described above. The conductive layer is selectively etched with an etching mask patterned above the conductive layer by using photolithography. The gate electrodes 7 are thus formed.

Next, an insulating film to be the interlayer insulating film 8, the sense interlayer insulating film 18, and the dummy sense interlayer insulating film 28 is formed above the gate electrodes 7 by a CVD method, for example. By selective removal of the insulating film by using, for example, a dry etching method, the gate insulating films 6, the sense gate insulating films 16, the dummy sense gate insulating films 26, the interlayer insulating films 8, the sense interlayer insulating films 18, and the dummy sense interlayer insulating films 28 are formed. At this time, a contact hole is formed in each gate insulating film and each interlayer insulating film.

Subsequently, a metal material to be the source electrode 9 and the sense source electrode 19 is deposited on the interlayer insulating films 8, the sense interlayer insulating films 18, and the dummy sense interlayer insulating films 28 by using, for example, sputtering. The source electrode 9 and the sense source electrode 19 are formed by patterning by, for example, lift-off or wet etching.

Through the contact holes, the source electrode 9 is connected to the well region 3 and the source region 4 by ohmic contact, and is connected to the drift layer 2 by Schottky contact. Through the contact holes, the sense source electrode 19 is connected to the sense well regions 13, the sense source regions 14, and the dummy sense well regions 23 by ohmic contact, and is connected to the drift layer 2 by Schottky contact. As a result, a Schottky junction 5 is formed at a portion where the source electrode 9 and the drift layer 2 are in contact with each other, and a Schottky junction 15 and a Schottky junction 25 are formed at a portion where the sense source electrode 19 and the drift layer 2 are in contact with each other.

Next, the drain electrode 10 that makes ohmic contact with the semiconductor substrate 1 is formed on the back surface of the semiconductor substrate 1. The semiconductor substrate 1 may be removed by polishing or other methods, and form the drain electrode 10 that makes ohmic contact with the drift layer 2 on the back surface of the drift layer.

The semiconductor device 101 according to Embodiment 1 shown in FIG. 1 and other figures can be obtained through the above process.

[Characteristics]

Figure 8:
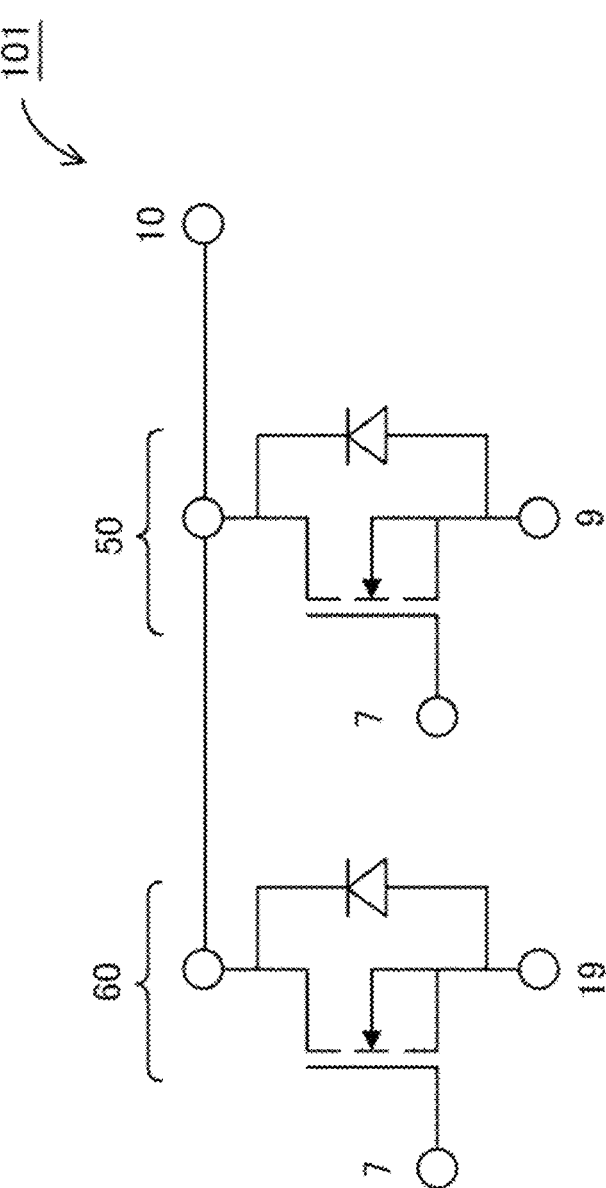
FIG. 8 is a circuit diagram showing the semiconductor device according to Embodiment 1.

A current detection operation and other operations in the semiconductor device 101 are described. FIG. 8 is a circuit diagram schematically showing the configuration of the semiconductor device 101 as an electric circuit. As is apparent from FIG. 8, the forward current flowing from the drain electrode 10 flows through the main region 50 to the source electrode 9, and also flows through the sense region 60 to the sense source electrode 19. The current flowing through the entire semiconductor device 101 including the main region 50 can be estimated from calculations based on a measurement of the current flowing through the sense region 60 with a galvanometer connected to the sense source electrode 19. By diverting a part of the current flowing from the drain electrode 10 to the sense region 60 and using the result of measurement of the current flowing through the sense region 60, the current flowing through the semiconductor device 101 can be detected with low loss compared to the case of direct measurement of the current flowing through the main region 50.

For the conventional semiconductor device, in order to suppress the loss due to the current flowing through the sense region, the area of the sense region is required to be smaller to make the proportion of the current diverted to the sense region smaller. However, since a smaller area of the sense region leads to a smaller capacitance, the semiconductor device may be destroyed if a surge voltage caused by the static electricity of the human body is applied during handling.

Therefore, as shown in FIG. 3 and other figures, the semiconductor device 101 according to Embodiment 1 includes the dummy sense region 62 having the dummy sense well regions 23 whose total area is larger than that of the sense well regions 13. In a facing area FA, where a dummy sense well region 23 and a gate electrode 7 face each other through a dummy sense gate insulating film 26, a capacitor is formed between the sense source electrode 19 and the gate electrode 7. Thus, a larger designed area of dummy sense region 62 leads to a larger capacitance of capacitors, and relaxes electric fields in the sense gate insulating films 16 and the dummy sense gate insulating films 26 when the static electricity is applied, preventing the dielectric breakdown of these gate insulating films. That is, the electrostatic withstand capability of the semiconductor device 101 can be improved.

In the dummy sense region 62, when a positive voltage exceeding a certain value with respect to the sense source electrode 19 is applied to a gate electrode 7, an inversion layer is formed in a region where a dummy sense well region 23 contacts the gate electrode 7 via a dummy sense gate insulating film 26. Therefore, the capacitance can be further increased by an amount corresponding to the charge of the minority carrier forming the inversion layer.

As shown in FIG. 3 and other figures, no source regions are formed in the dummy sense well regions 23. Thus, the voltage applied to a gate electrode 7 forms an inversion layer at the interface between a dummy sense well region 23 and the gate electrode 7 as described above, but forms no conduction path from the drift layer 2 to the sense source electrode 19. This causes the forward current in the sense region 60 to flow only through the active sense region 61, not through the dummy sense region 62. Therefore, a smaller designed active sense region 61 can make, of the current flowing through the entire semiconductor device 101, the proportion of the current flowing through the main region 50 smaller than the proportion of the current flowing through the sense region 60, thereby suppressing the loss.

The provision of the dummy sense region 62 thus ensures a desired capacitance to improve the electrostatic withstand capability of the semiconductor device 101, while suppressing the current loss in the sense region 60.

The following problems are unique to silicon carbide-based semiconductor devices. A semiconductor device such as a MOSFET includes a p-n diode formed of a well region and a drift layer. While a forward current flows through the MOSFET structure, a freewheel current, which is a reverse current, may flow in the p-n diode (hereinafter referred to as bipolar conduction). In the case of bipolar conduction of the p-n diode, minority carriers injected into the drift layer recombine with majority carriers in the drift layer, thereby generating energy. This may cause a disorder in the periodic structure of the semiconductor, that is, so-called bipolar degradation in which crystal defects gain energy and expand to degrade the device. Bipolar degradation increases the device resistance to the forward current, and increases the conduction loss when a current flows with the same current density. The degradation may be more critical in wide-bandgap semiconductors such as silicon carbide; one of the reasons is that these semiconductors are larger than silicon in the energy generated at the time of the above-described recombination.

Synchronous rectification is a technique for suppressing bipolar deterioration. This is a technique in which a voltage is applied to the gate electrode synchronously with the timing at which a freewheel current is to flow through the semiconductor device, thereby allowing the freewheel current to flow through a formed channel. The synchronous rectification enables suppressing the bipolar conduction of a p-n diode in a region including a MOSFET structure where a channel is formed (such as the main region 50 and active sense region 61 of the semiconductor device 101).

However, even the synchronous rectification is performed, the bipolar conduction of a p-n diode is allowed in a region where no channel is formed (such as the dummy sense region 62 of the semiconductor device 101). As described above, the dummy sense region 62 is designed so that no current flows through the channel to keep the current flowing through the sense region 60 low. Thus, the synchronous rectification cannot suppress the bipolar conduction in the dummy sense region 62. Further, since the dummy sense well regions 23 are formed to have a larger area than the sense well regions 13, a current flowing through a p-n diode in a dummy sense well region 23 may cause bipolar degradation of the device with a high probability.

The semiconductor device 101 according to Embodiment 1 includes an SBD formed of a Schottky junction 25 formed at a portion where the sense source electrode 19 and the drift layer 2 are in contact with each other, as shown in FIG. 3 and other figures. The turn-on voltage of the SDB is lower than the operating voltage of the p-n diode formed of the dummy sense well region 23 and the drift layer 2. This allows the freewheel current to flow through the SBD and hardly flow through the p-n diode, thus suppressing bipolar degradation.

As described above, bipolar degradation can be suppressed in a portion near an SBD, but there is a possibility that bipolar degradation occurs in a portion far from the SBD. On the other hand, the excessively large number or area of SBDs reduces the capacitance in the dummy sense region 62. To address this, in the semiconductor device 101 of Embodiment 1, the facing areas FA and the SBDs (Schottky junctions 25) shown in FIG. 3 are provided in such a way that they are mixed in the dummy sense region 62. Preferably, as shown in FIGS. 4 to 7, the SBDs (Schottky junctions 25) and the facing areas FA are provided alternately and repeatedly in a plan view. This allows the capacitors formed between the sense source electrodes 19 and the gate electrodes 7 to be disposed in a well-balanced manner in the facing areas FA and the SBDs in the dummy sense region 62. This enables the suppression of bipolar degradation, while suppressing the reduction of the capacitance in the dummy sense region 62.

Preferably, the SBDs in the dummy sense region 62 are provided alternately and repeatedly from the boundary region 70 toward the active sense region 61. This allows the SBDs to be uniformly disposed at necessary positions in the dummy sense region 62, enabling the suppression of bipolar degradation, while suppressing the reduction of the capacitance in the dummy sense region 62.

In the semiconductor device 101, the Schottky junctions 5 are formed in the main region 50 and the Schottky junctions 15 are formed in the active sense region 61. That is, in the semiconductor device 101, the SBDs are provided not only in the dummy sense region 62 but also in the main region 50 and the active sense region 61. The bipolar conduction of the p-n diode thus can be suppressed in the entire area of the semiconductor device 101 without performing synchronous rectification.

Preferably, the interval between SBDs is set as follows. In the main region 50, a distance between a p-n junction (a portion where a well region 3 and the drift layer 2 are in contact with each other) having the longest distance to its nearest SBD (a Schottky junction 5) and the nearest SBD is defined as a distance x. In the dummy sense region 62, a distance between a p-n junction (a portion where a dummy sense well region 23 and the drift layer 2 are in contact with each other) having the longest distance to its nearest SBD (a Schottky junction 25) and the nearest SBD is defined as a distance y. Here, the distance y in the dummy sense region 62 is designed to be not more than twice the distance x in the main region 50. That is, the SBDs are disposed in such a way that the arrangement interval between the SBDs in the dummy sense region 62 is no more than twice the arrangement interval between the SBDs in the main region 50.

The maximum value of a freewheel current that can flow through an SBD without flowing through a p-n diode (hereinafter referred to as the maximum unipolar current value) is determined according to a distance defined as the distance x or the distance y described above. Let Y be the maximum value of the distance y that allows the desired maximum unipolar current value in dummy sense region 62. When the distance y is further increased from the maximum value Y, a current begins to flow in the p-n diode, and the current passing through the p-n diode increases at an accelerated rate. For this reason, the arrangement interval of the SBDs is set as the above description.

Preferably, the SBDs are disposed at intervals of 1 μm to 100 μm in the dummy sense region 62. The arrangement at such intervals enables the suppression of bipolar degradation, while suppressing the reduction of the capacitance in the dummy sense region 62.

As shown in FIGS. 4 to 7, the SBDs may be periodically provided in the dummy sense region 62. As shown in FIGS. 4, 6, and 7, the SBDs may be provided at a plurality of positions so as to be dispersed in the dummy sense region 62. Preferably, the SBDs are provided in the dummy sense region 62 in such a way that a distance between a p-n junction having the longest distance to its nearest SBD (that is, a p-n junction having the longest distance from an SBD) and the nearest SBD is no more than half of the arrangement interval of the SBDs. Such an arrangement enables the suppression of bipolar degradation, while suppressing the reduction of the capacitance in the dummy sense region 62.

As shown in FIG. 1, the active sense region 61 (the sense well regions 13) is preferably provided in one block without being divided by the dummy sense region 62 (the dummy sense well regions 23) in a plan view in the semiconductor device 101 according to Embodiment 1. The reason is as follows. The forward current flowing through the active sense region 61 partly flows and spreads to the surrounding dummy sense region 62. If the active sense region 61 is disposed so as to be divided by the dummy sense region 62, a portion of the forward current flowing and spreading in the dummy sense region 62 increases, making it appear as if the resistance of the sense region 60 is low. This may prevent obtaining the accurate current flowing through the main region 50. The reason is to avoid this.

The dummy sense well regions 23 are not ohmically connected to the source electrode 9 in the semiconductor device 101 according to Embodiment 1. The reason is as follows. The dummy sense well regions 23 are ohmically connected to the sense source electrode 19. If the dummy sense well regions 23 are ohmically connected to the source electrode 9, the sense source electrode 19 and the source electrode 9 are electrically connected to each other via the dummy sense well regions 23, and current flows between both electrodes. This may prevent detecting the accurate current flowing through the semiconductor device 101. The reason is to avoid this.

As described above, Embodiment 1 enables the suppression of bipolar degradation, while suppressing the reduction of the capacitance in the dummy sense region 62; this suppresses an increase in conduction loss due to expansion of crystal defects while ensuring a desired capacitance in the dummy sense region 62. Therefore, the reliability of the semiconductor device 101 can be improved.

[Variations]

Figure 9:
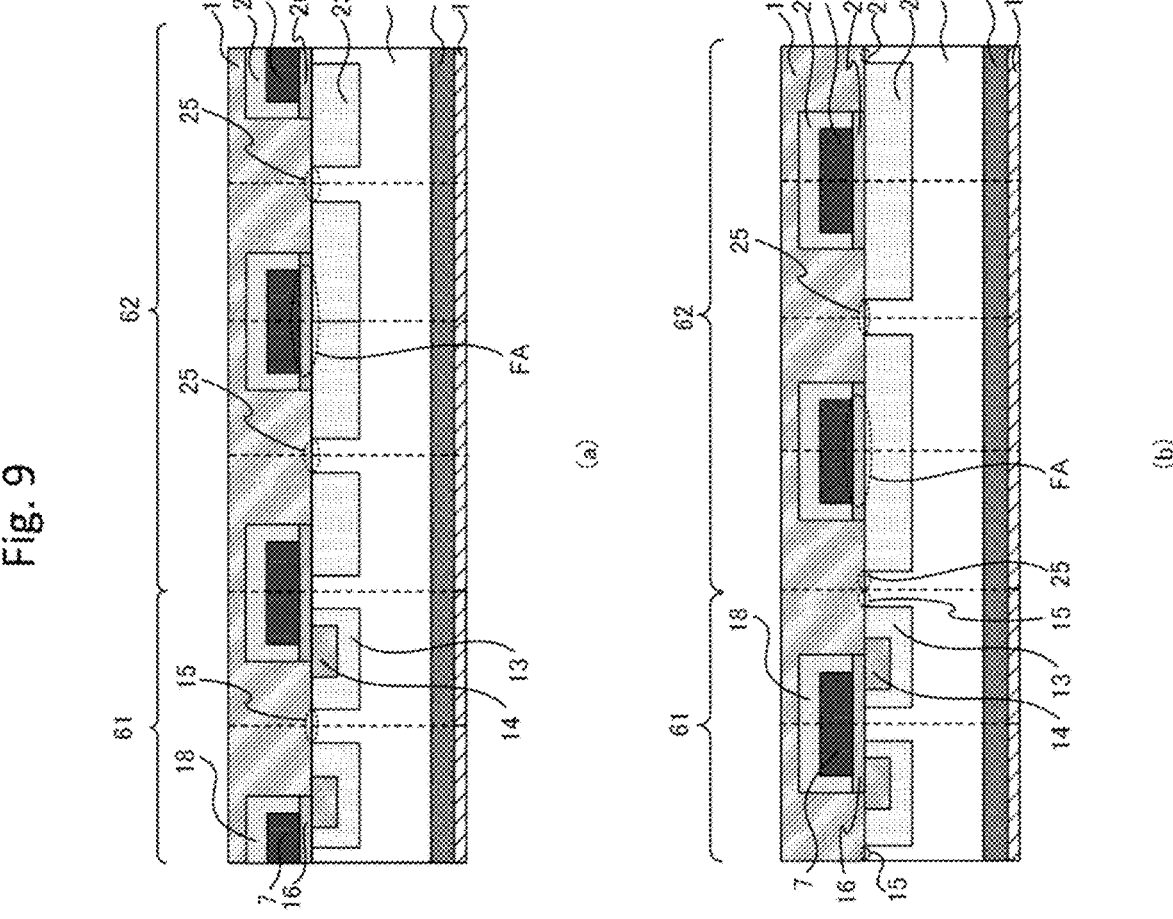
FIG. 9 shows schematic cross-sectional views of a sense region of a semiconductor device according to a variation of Embodiment 1.

Next, variations of the semiconductor device 101 according to Embodiment 1 will be described. FIG. 9 (*a*) is a schematic cross-sectional view showing a cross-section of a part of the sense region 60 according to a variation of Embodiment 1. The structure shown in FIG. 9(*a*) is similar to that shown in FIG. 3(*a*), except for the dummy sense well regions 23. In the structure of FIG. 9(*a*), the dummy sense well regions 23 are provided with no space between them below the gate electrodes 7, and the drift layer 2 is not in contact with the dummy sense gate insulating films 26. The cross-section of the semiconductor device 101 is not limited to that shown in FIG. 9(*a*), and may be the structure shown in FIG. 9(*b*), for example.

Figure 10:
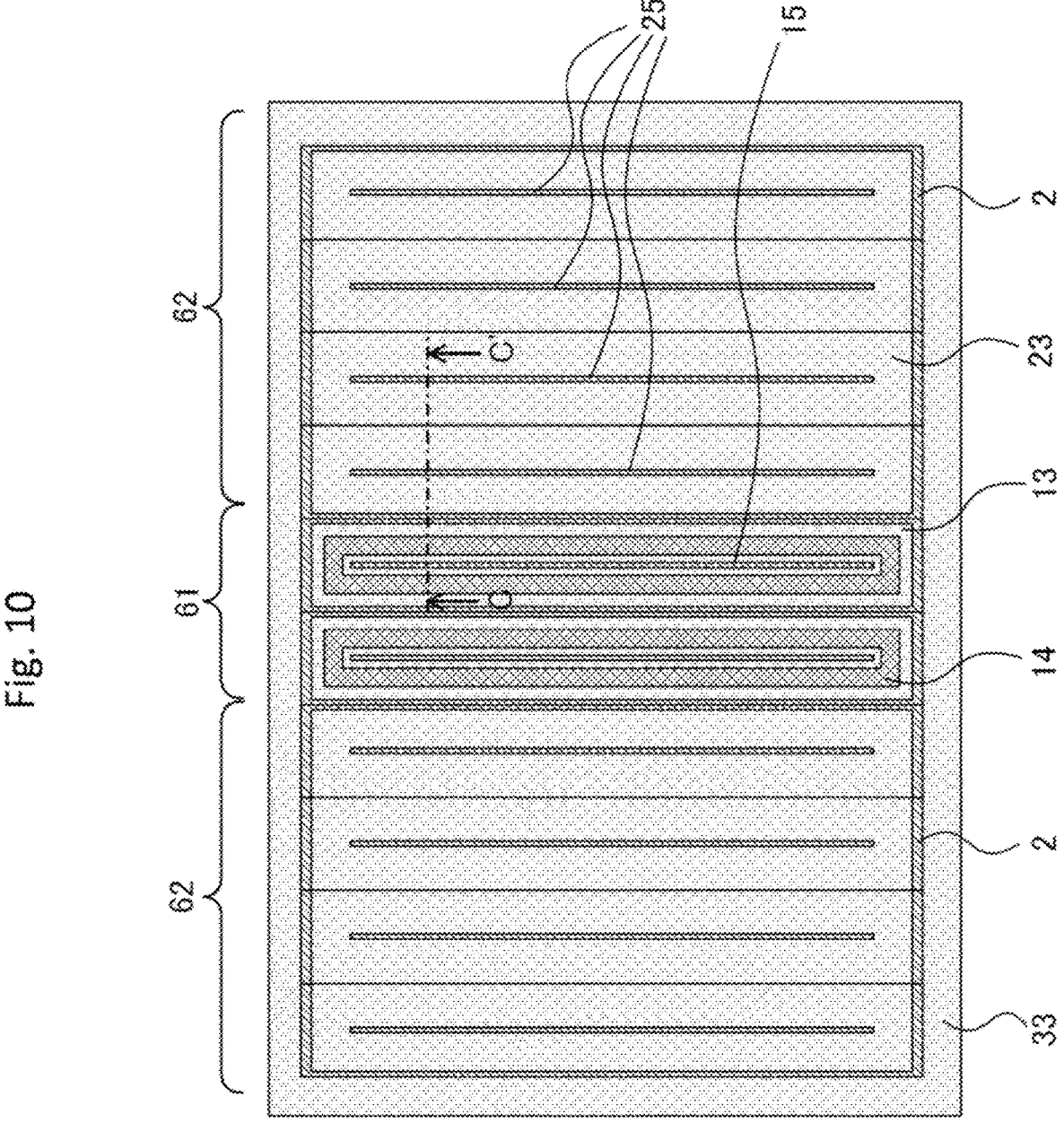
FIG. 10 is a diagram showing an example of an arrangement pattern of the sense region of the semiconductor device according to the variation of Embodiment 1.

FIG. 10 is an enlarged view of the sense region 60 and its periphery shown in FIG. 1, showing an exemplified arrangement pattern of each region in the sense region 60. FIG. 10 shows an upper surface of the semiconductor layer without each gate insulating film, the gate electrodes 7, each interlayer insulating film, and the sense source electrode 19 for simplicity. The cross-section C-C' in FIG. 10 corresponds to FIG. 9(*a*).

FIG. 10 shows a striped (comb-shaped) arrangement of the unit cells constituting the active sense region 61 and the dummy sense region 62. The active sense region 61 has a Schottky junction 15 surrounded by a sense well region 13 and a sense source region 14. The dummy sense region 62 has a Schottky junction 25 surrounded by a dummy sense well region 23.

Figure 11:
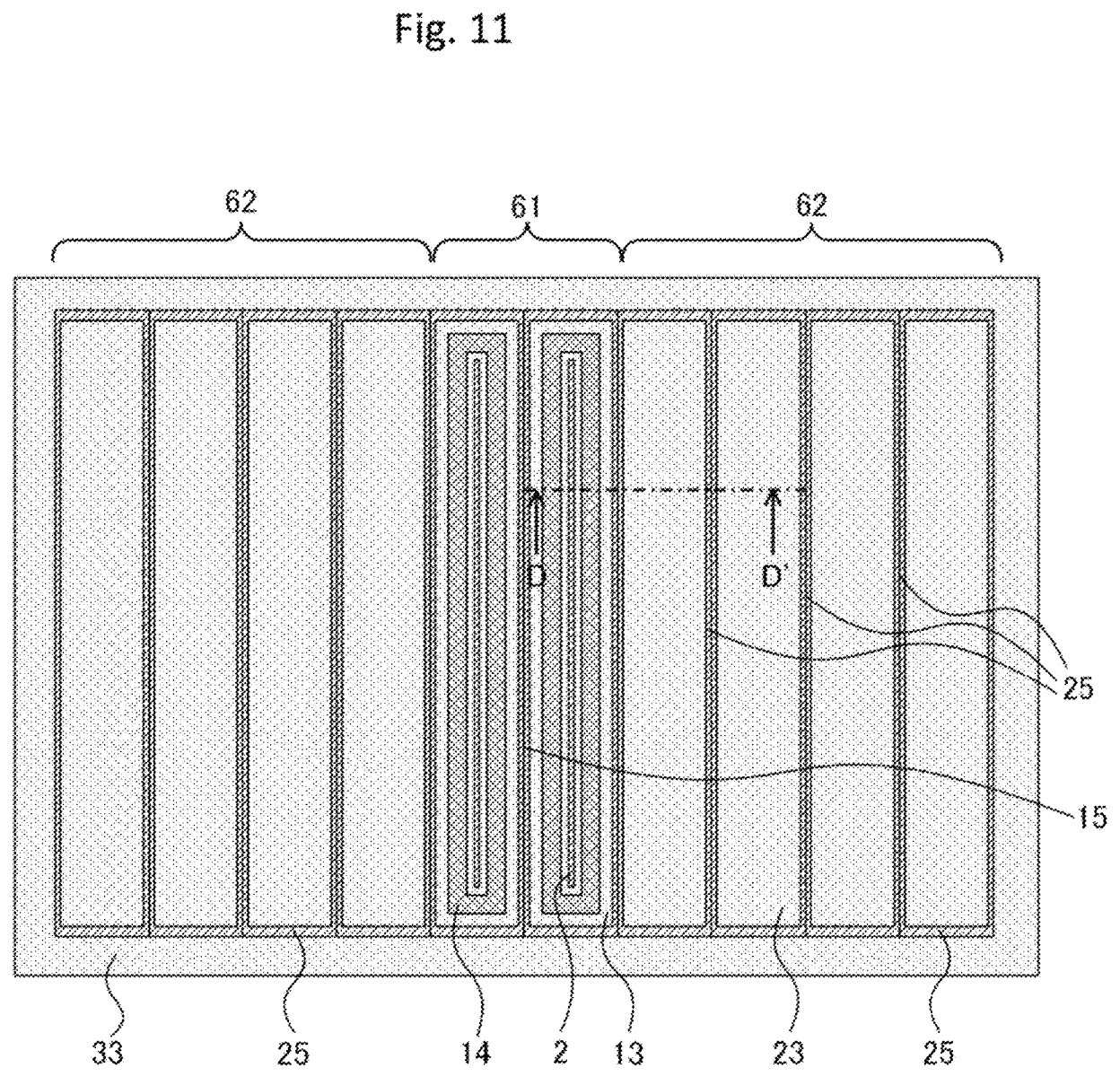

FIG. 11 is an enlarged view of the sense region 60 and its periphery shown in FIG. 1, showing another exemplified arrangement pattern of each region in the sense region 60.

FIG. 11 also shows an upper surface of the semiconductor layer without each gate insulating film, the gate electrodes 7, each interlayer insulating film, and the sense source electrode 19 for simplicity. The cross-section D-D' in FIG. 11 corresponds to FIG. 9(*b*).

Similar to FIG. 10, FIG. 11 shows a striped (comb-shaped) arrangement of the unit cells constituting the active sense region 61 and the dummy sense region 62. In the active sense region 61, unlike FIG. 10, a sense well region 13 and a sense source region 14 are surrounded by a Schottky junction 15. In the dummy sense region 62, a dummy sense well region 23 is surrounded by a Schottky junction 25.

Figure 12:
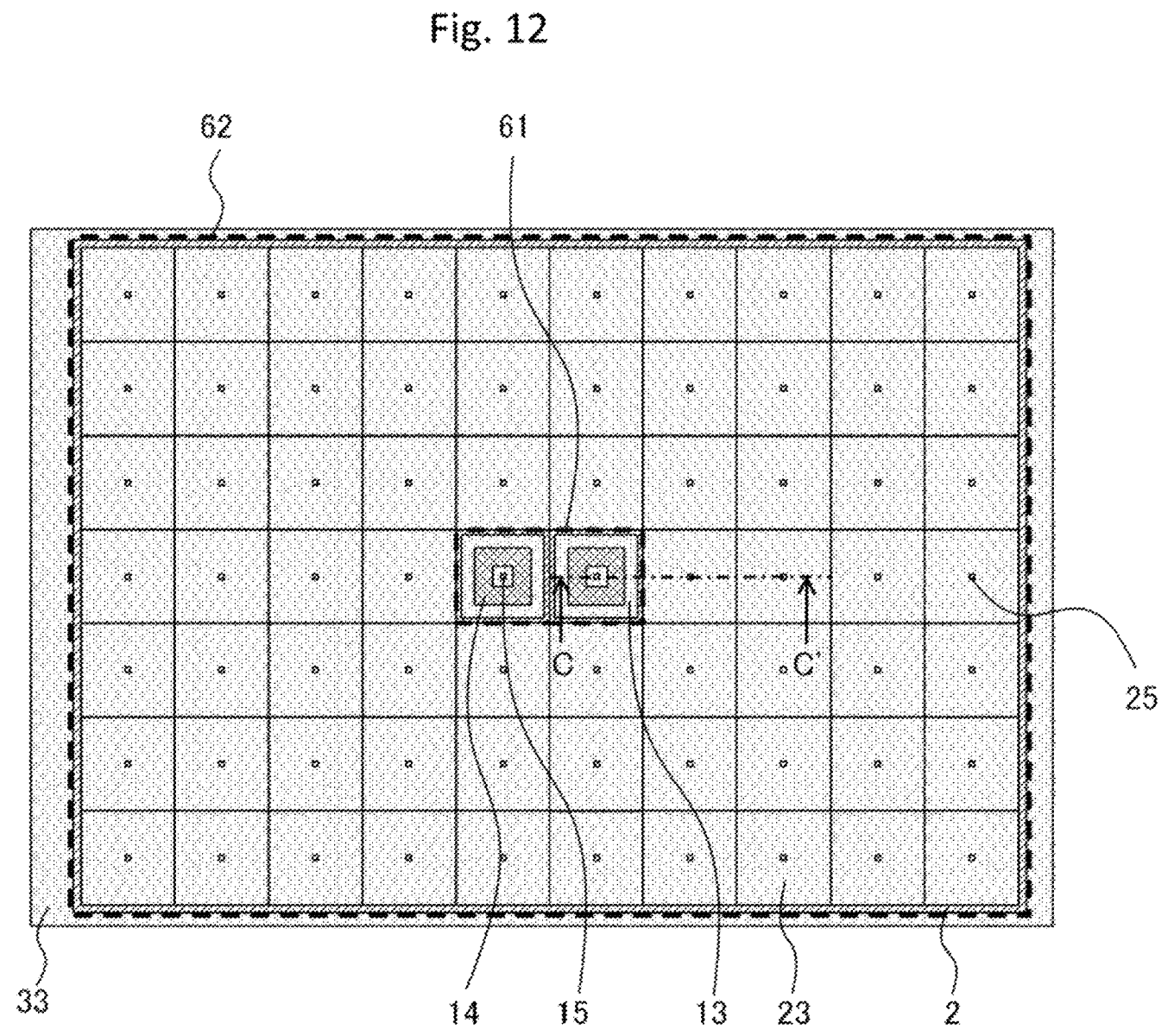

FIG. 12 is an enlarged view of the sense region 60 and its periphery shown in FIG. 1, showing another exemplified arrangement pattern of each region in the sense region 60. FIG. 12 also shows an upper surface of the semiconductor layer without each gate insulating film, the gate electrodes 7, each interlayer insulating film, and the sense source electrode 19 for simplicity. The cross-section C-C' in FIG. 12 corresponds to FIG. 9(*a*).

FIG. 12 shows a lattice-shaped arrangement of the unit cells constituting the active sense region 61 and the dummy sense region 62. In the active sense region 61, a Schottky junction 15 is surrounded by a sense well region 13 and a sense source region 14. In the dummy sense region 62, a Schottky junction 25 is surrounded by a dummy sense well region 23.

In FIGS. 10 to 12, the Schottky junctions 25 are periodically arranged in the dummy sense region 62. In FIGS. 10 and 12, the Schottky junctions 25 are provided at a plurality of positions so as to be dispersed in the dummy sense region 62.

In the structures of the variations shown in FIGS. 10 to 12, the area of a dummy sense well region 23 facing a gate electrode 7 is larger than that in the structures shown in FIGS. 4 to 7. Since the area of the dummy sense well region 23 facing the gate electrode 7 can be increased, the capacitance per unit area between the sense source electrode 19 and the gate electrode 7 can be increased.

Also, in FIGS. 10 to 12 according to the variations, similar to FIGS. 4 to 7, the SBDs (Schottky junctions 25) and the facing areas FA shown in FIG. 9 are provided alternately and repeatedly in a plan view. This enables the suppression of bipolar degradation, while suppressing the reduction of the capacitance in the dummy sense region 62. In addition, these structures produce effects similar to those shown in FIG. 4 to 7.

In the above, Embodiment 1 and its variations shown FIGS. 4 to 7 and FIGS. 10 to 12 are described as the arrangement patterns of each region in the sense region 60, but the arrangement patterns are not limited to these. For example, each arrangement pattern may have any number of unit cells. The arrangement pattern may be other arrangement patterns similar to these. For example, the lattice-shaped arranged unit cells shown in FIGS. 6 and 12 may be arranged so as to be shifted from each other in each column, or a plurality of hexagonal unit cells may be arranged to form a honeycomb shape.

The arrangement pattern of each region is not limited to periodic structures as shown in FIGS. 4 to 7 and FIGS. 10 to 12. For example, instead of forming Schottky junctions at all connection portions between the drift layer 2 and the sense source electrode 19, various patterns, such as one having SBDs arranged at every second connection portion, or an irregular one in which every second and every third are mixed, are conceivable. Such arrangement patterns also produce the above-described effect by providing the SBDs and the facing areas FA in a mixed manner in the dummy sense region 62 or providing alternately and repeatedly the SBDs and the facing areas FA.

In the present embodiment, as shown in FIG. 2, below a gate electrode 7 and between well regions 3, the drift layer 2 is provided so as to be in contact with a gate insulating film 6. Also, as shown in FIGS. 3 and 9, below a gate electrode 7 and between sense well regions 13, the drift layer 2 is provided so as to be in contact with a sense gate insulating film 16. A region formed of the drift layer 2 between the well regions and in contact with the gate insulating film is referred to as a JFET region, etc. The JFET region of the semiconductor device 101 according to Embodiment 1 is of n-type like the drift layer 2 and has the same impurity concentration as the drift layer 2. The impurity concentration of the JFET region is not limited to this, and may be set higher than the n-type impurity concentration of the drift layer 2.

Embodiment 2

Figure 13:
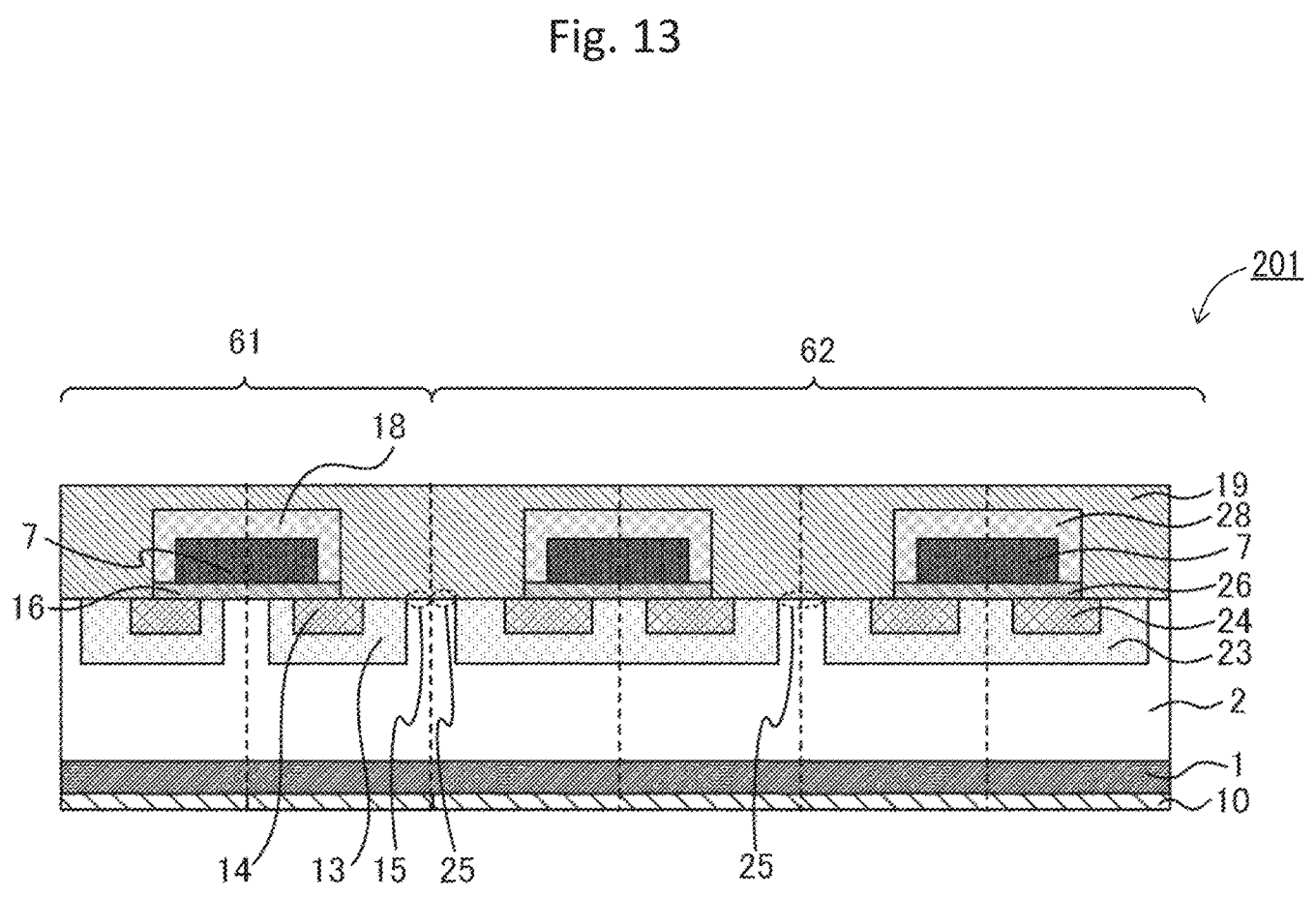

FIG. 13 is a schematic cross-sectional view showing a cross-section of a part of a sense region 60 of a semiconductor device 201 according to Embodiment 2. Unlike the semiconductor device 101 according to Embodiment 1, the semiconductor device 201 according to Embodiment 2 has dummy sense source regions 24. A dummy sense source region 24 is an n-type region selectively formed in a surface layer of a dummy sense well region 23. The dummy sense source region 24 is ohmically connected to a sense source electrode 19. The dummy sense source region 24 faces a dummy sense gate insulating film 26 and is opposite to a gate electrode 7 through the dummy sense gate insulating film 26. The other components are similar to those of the semiconductor device 101 according to Embodiment 1.

Hereinafter, the sense source region 14 and the dummy sense source region 24, including the source region 4, may be referred to as each source region.

Next, a method of manufacturing the semiconductor device 201 will be described. The dummy sense source region 24 can be formed at the same time and by using the same formation method as the source region 4 and the sense source region 14 in the method of manufacturing the semiconductor device 101 described in Embodiment 1. The dummy sense source region 24 may be formed in a process different from the process for forming the source region 4 and the sense source region 14. The other portions can be manufactured in the same manner as those of the semiconductor device 101.

The semiconductor device 201 according to Embodiment 2 includes the dummy sense source regions 24 disposed below the gate electrode 7 in the dummy sense region 62. This increases the capacitance of a capacitor formed between the sense source electrode 19 and the gate electrode 7. The capacitance increases approximately as much as when a channel is formed in the region where the dummy sense source region 24 is disposed. Since the capacitance does not vary greatly with a change in the gate potential, stable capacitance can be ensured in the dummy sense region 62.

Figure 14:
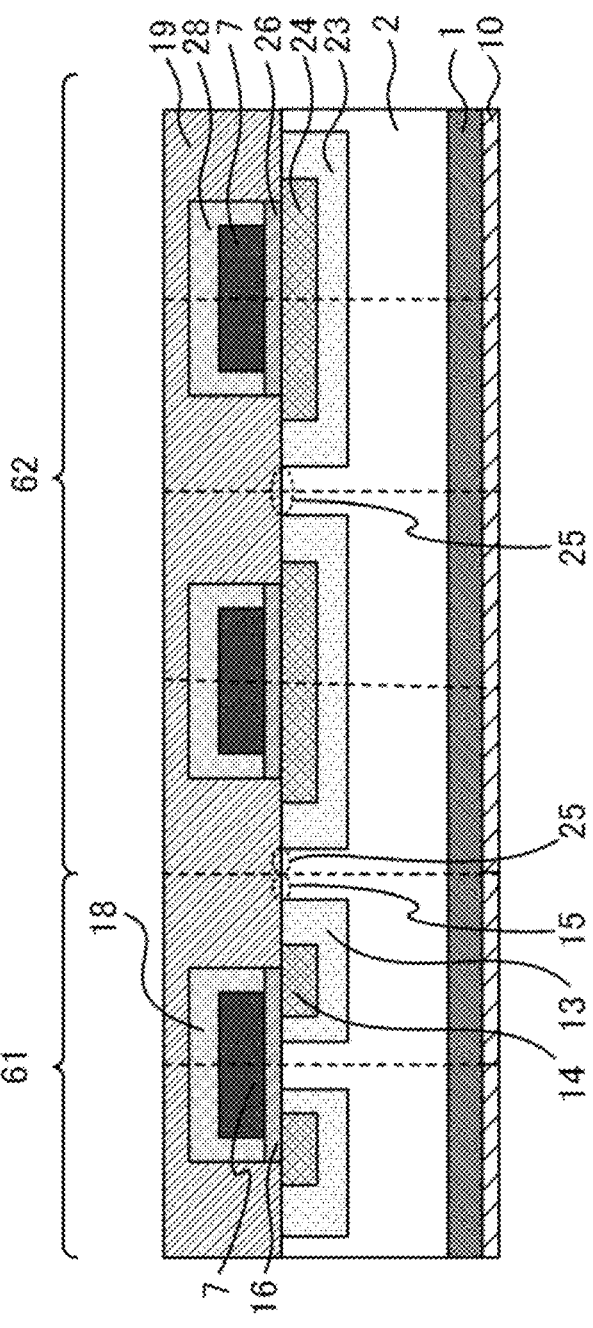
FIG. 14 is a schematic cross-sectional view of a sense region of a semiconductor device according to a variation of Embodiment 2.

Next, a variation of the semiconductor device 201 according to Embodiment 2 will be described. FIG. 14 is a schematic cross-sectional view showing a cross-section of a part of the sense region 60 according to a variation of Embodiment 2. In the structure shown in FIG. 13, a dummy sense well region 23 is provided below a gate electrode 7 and between dummy sense source regions 24 so as to be in contact with a dummy sense gate insulating film 26. In contrast, the structure shown in FIG. 14 has the dummy sense source regions 24 provided with no space between them below the gate electrode 7, and the dummy sense well region 23 is not in contact with the dummy sense gate insulating film 26. That is, the structure shown in FIG. 14 has a dummy sense source region 24 provided at a position opposed to a gate electrode 7 via a dummy sense gate insulating film 26 in a facing area FA, and a dummy sense well region 23 is not in contact with the dummy sense gate insulating film 26. The other portions are similar to those of the structure shown in FIG. 13.

In the structure of the variation, a portion in contact with the gate electrode 7 via the dummy sense gate insulating film 26 is occupied by the dummy sense source region 24 as shown in FIG. 14. Thus, the area of the dummy sense source region 24 is larger in the structure of the variation than in the structure shown in FIG. 13. This allows for an even larger capacitance per unit area between the sense source electrode 19 and the gate electrode 7.

The semiconductor device 201 according to Embodiment 2 and its variation also produce the same effects as those described in Embodiment 1.

Embodiment 3

Figure 15:
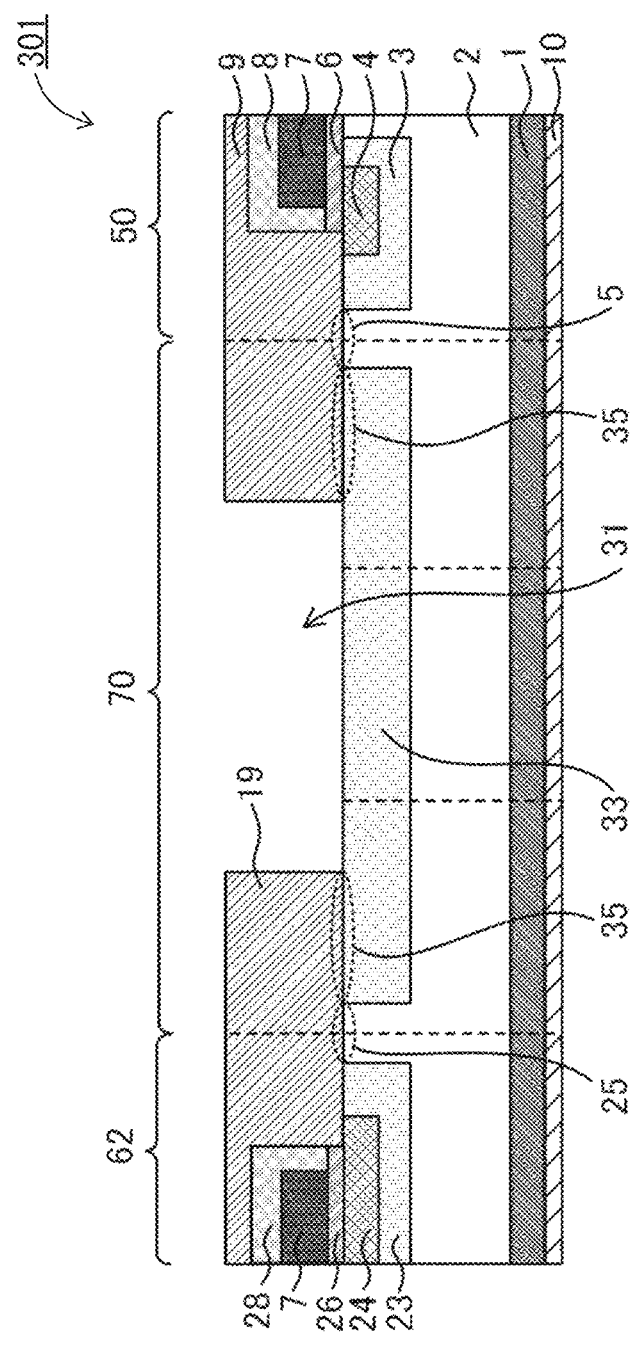
FIG. 15 is a schematic cross-sectional view of a boundary region of a semiconductor device according to Embodiment 3.

FIG. 15 is a schematic cross-sectional view showing a cross-section of a boundary region 70 of a semiconductor device 301 according to Embodiment 3. As shown in FIG. 15, the semiconductor device 301 further includes an inter-source-electrode region 31, a boundary well region 33, and Schottky junctions 35 in the boundary region 70, in addition to the components of the semiconductor device 101 or the semiconductor device 201.

A source electrode 9 and a sense source electrode 19 in the boundary region 70 are separated from each other, and the inter-source-electrode region 31 is formed between the source electrode 9 and the sense source electrode 19. The p-type boundary well region 33 is provided in a surface layer of a drift layer 2 below the inter-source-electrode region 31. The boundary well region 33 may be formed separately in a plurality of regions.

The boundary well region 33 in the semiconductor device 301 of Embodiment 3 is not connected to any of a well region 3, a sense well region 13, and a dummy sense well region 23. The boundary well region 33 is not ohmically connected to the source electrode 9 or the sense source electrode 19 but is Schottky-connected to them. A Schottky junction 35 is formed at a portion where the boundary well region 33 and the source electrode 9 are in contact with each other and a portion where the boundary well region and the sense source electrode 19 are in contact with each other. Schottky junction 35 may be formed at a plurality of locations. The other components are similar to those of the semiconductor device 101 or the semiconductor device 201.

Next, a method of manufacturing the semiconductor device 301 will be described. The boundary well region 33 can be formed at the same time and by using the same formation method as the well region 3 and the sense well region 13 in the method of manufacturing the semiconductor device 101 described in Embodiment 1. The boundary well region 33 may be formed in a process different from the process for forming the well region 3 and the sense well region 13.

The source electrode 9 and the sense source electrode 19 are formed by forming a metal material to be the source electrode 9 and the sense source electrode 19 above the interlayer insulating films 8, the sense interlayer insulating films 18, and the dummy sense interlayer insulating films 28, and then patterning the material by lift-off or wet etching to isolate the electrodes from each other. At this time, the inter-source-electrode region 31 is formed between the source electrode 9 and the sense source electrode 19.

The source electrode 9 is connected to the boundary well region 33 by Schottky contact, and the sense source electrode 19 is connected to the boundary well region 33 by Schottky contact. The Schottky junction 35 is accordingly formed in a portion where the source electrode 9 and the boundary well region 33 are in contact with each other and a portion where the sense source electrode 19 and the boundary well region 33 are in contact with each other. The other portions can be manufactured in the same manner as those of the semiconductor device 101.

The boundary region 70 is a region mandatory when the sense region 60 is provided in the semiconductor device. This is because separation of the source electrode 9 and the sense source electrode 19 is necessary. The separation of the source electrode 9 and the sense source electrode 19 is done by lift-off or wet etching as described above. Thus, accounting for process variation, the inter-source-electrode region 31 is designed to have a relatively large area.

However, if too large an area of the drift layer 2 is exposed on the surface of the semiconductor layer, a high electric field applied to the surface of the semiconductor layer may cause discharge. This requires the disposition of the boundary well region 33 below the inter-source-electrode region 31. Note that, the boundary well region 33 does not need to completely fill the surface of the semiconductor layer of the boundary region 70, because it is sufficient to prevent the occurrence of the discharge.

However, no SBD can be provided in the inter-source-electrode region 31 because the source electrode 9 or the sense source electrode 19 is not provided in the boundary region 70. Here, in the boundary region 70, a distance between a p-n junction (a portion where the boundary well region 33 and the drift layer 2 are in contact with each other) having the longest distance to its nearest SBD (a Schottky junction 5 or a Schottky junction 25 in FIG. 15) and the nearest SBD is defined as a distance z. At this time, the distance z having a relatively large value may allow a current to flow through a p-n diode formed of the boundary well region 33 and the drift layer 2. Furthermore, because the ratio of the area of the boundary well region 33 to the area of the entire semiconductor device is relatively large, the device has a relatively high probability of bipolar degradation.

Thus, as shown in FIG. 15, in the semiconductor device 301 according to Embodiment 3, the boundary well region 33 is not connected to each well region and is not ohmically connected to each source electrode. That is, the boundary well region 33 is floating from each well region and each source electrode. This prevents bipolar conduction of the p-n diode formed of the boundary well region 33 and the drift layer 2.

As shown in FIG. 15, of the well region 3 and the dummy sense well region 23 adjacent to the boundary well region 33, no channel is formed in the surface layers thereof on the side closer to the boundary well region 33. In other words, no JFET region is formed at a position in contact with the boundary well region 33. As above, it is preferable that no forward current flows in the vicinity of the boundary well region 33. Since the boundary well region 33 is floating, its potential is unstable and the electric resistance around the region is easily changed. Therefore, preventing the forward current from flowing through the boundary well region 33 enables stabilization of the device characteristics.

Embodiment 4

Figure 16:
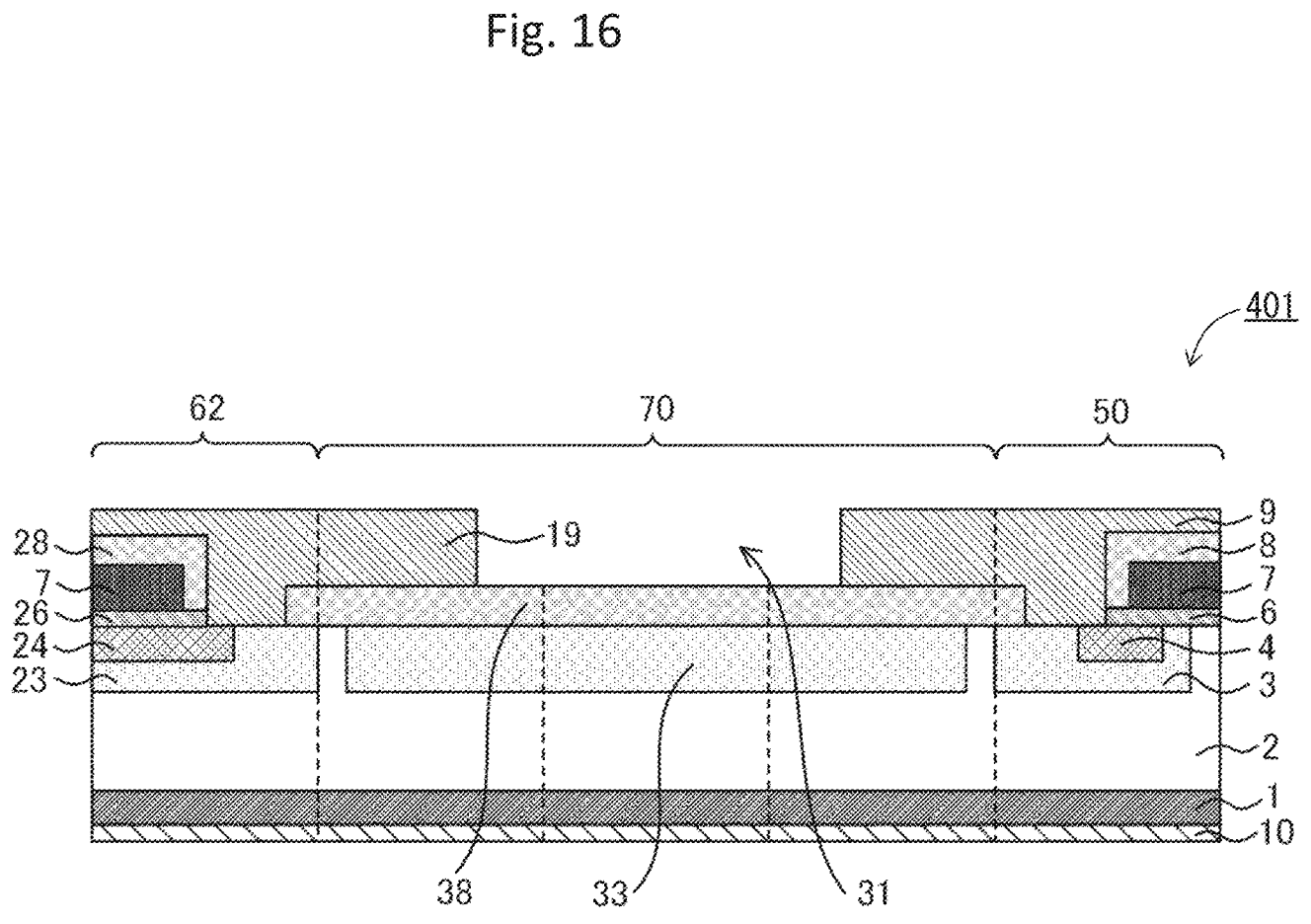

FIG. 16 is a schematic cross-sectional view showing a cross-section of a boundary region 70 of a semiconductor device 401 according to Embodiment 4. As shown in FIG. 16, the semiconductor device 401 further includes an inter-source-electrode region 31, a boundary well region 33, and an insulating film 38 provided in the boundary region 70, in addition to the components of the semiconductor device 101 or the semiconductor device 201. What is different from the semiconductor device 301 according to Embodiment 3 is that the insulating film 38 is added instead of forming the Schottky junction 35.

In the boundary region 70, the insulating film 38 is formed above the boundary well region 33 and the drift layer 2 so as to cover the boundary well region 33. The insulating film 38 is formed between the boundary well region 33 and the source electrode 9 and between the boundary well region 33 and the sense source electrode 19. The boundary well region 33 is not Schottky-connected to either the source electrode 9 or the sense source electrode 19, but is separated from them by the insulating film 38.

Next, a method of manufacturing the semiconductor device 401 will be described. The insulating film 38 can be formed by using the manufacturing method of the semiconductor device 101 described in Embodiment 1, in which an insulating film to be each interlayer insulating film is formed above the gate electrode 7, and then the insulating film is left above the boundary well region 33 at the time of selective removal of the insulating film for forming the interlayer insulating films 8, the sense interlayer insulating films 18, and the dummy sense interlayer insulating films 28. Alternatively, the insulating film 38 may be formed, after the activation annealing and before the formation of the source electrode 9 and the sense source electrode 19, by separately depositing an insulating film above the semiconductor layer by a CVD method or other methods and then patterning the insulating film. The other portions can be manufactured in the same manner as those of the semiconductor device 101.

In the semiconductor device 401 according to Embodiment 4, the insulating film 38 is formed between the boundary well region 33 and the source electrode 9, and between the boundary well region 33 and the sense source electrode 19. Therefore, as compared with the semiconductor device 301, the boundary well region 33 is more electrically isolated from the source electrode 9 and the sense source electrode 19. This enhances the effect of suppressing bipolar conduction in a p-n diode formed of the boundary well region 33 and the drift layer 2.

Embodiment 5

Figure 17:
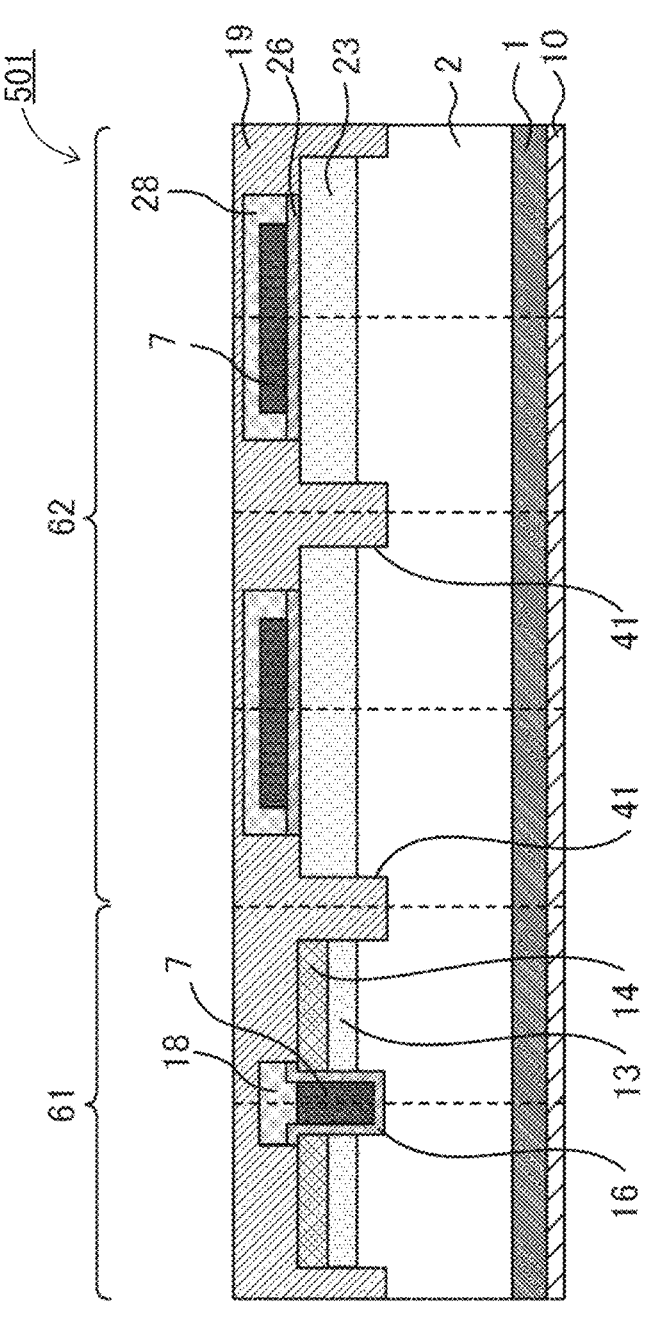
FIG. 17 is a schematic cross-sectional view of a sense region of a semiconductor device according to Embodiment 5.

FIG. 17 is a schematic cross-sectional view showing a cross-section of a part of a sense region 60 of a semiconductor device 501 according to Embodiment 5. The semiconductor device 501 according to Embodiment 5 is different from the semiconductor device 101 according to Embodiment 1 in the formation position of the SBD, the formation method of the gate structure, etc. The other components are similar to those of the semiconductor device 101 according to Embodiment 1.

In the active sense region 61 of the semiconductor device 501 shown FIG. 17, trenches (first trenches) 41 are formed between sense well regions 13 and between sense source regions 14 in the surface layer of the semiconductor layer so as to extend from the surface of the semiconductor layer through the sense well regions 13 and the sense source regions 14 to a drift layer 2. In the dummy sense region 62, the trenches (first trenches) 41 are formed between dummy sense well regions 23 in the surface layer of the semiconductor layer so as to extend from the surface of the semiconductor layer through the dummy sense well regions 23 to the drift layer 2. The sense source electrode 19 is provided in these trenches 41. The sense source electrode 19 of the semiconductor device 501 is Schottky-connected to the drift layer 2 on at least one of the bottom or side surfaces of the trenches 41. In other words, an SBD is formed in a portion where the sense source electrode 19 faces the drift layer 2 on at least one of the bottom or side surfaces of the trenches 41.

In the active sense region 61, a sense gate insulating film 16 and a gate electrode 7 are provided in a trench extending from the surface of the semiconductor layer to the drift layer 2 through a sense well region 13 and a sense source region 14. The sense gate insulating film 16 is in contact with the sense well region 13 and the sense source region 14 on a side surface of the trench. The gate electrode 7 faces the sense well region 13 and the sense source region 14 via the sense gate insulating film 16.

Next, a method of manufacturing the semiconductor device 501 will be described. Each well region and each source region are formed above the drift layer 2 according to the manufacturing method of the semiconductor device 101 described in Embodiment 1, and the surface of the semiconductor layer is selectively etched with the patterned etching mask, thereby forming the trench that extends through the sense well region 13 and the sense source region 14 to the drift layer 2. Then, in the active sense region 61, the sense gate insulating film 16 is formed on the bottom and side surfaces of the trench, and the gate electrode 7 is formed so as to fill the inside of the trench.

The trenches 41 are also formed by forming each well region and each source region on the drift layer 2 and then selectively etching the surface of the semiconductor layer with the patterned etching mask. After each interlayer insulating film is formed, the sense source electrode 19 is formed in the active sense region 61 and the dummy sense region 62 so as to fill the trenches 41. The sense source electrode 19 is connected to each well region and each source region by ohmic contact, and is connected to the drift layer 2 by Schottky contact. As a result, a Schottky junction 15 and a Schottky junction 25 are formed at a portion where the sense source electrode 19 and the drift layer 2 are in contact with each other. The other portions can be manufactured in the same manner as those of the semiconductor device 101.

In the semiconductor device 501 according to Embodiment 5, an SBD (Schottky junction 15 or Schottky junction 25) is formed in a portion where the sense source electrode 19 and the drift layer 2 are in contact with each other in a trench 41. In contrast, in the semiconductor device 101 according to Embodiment 1, the SBD is formed at a position sandwiched between the well regions. Therefore, the resistance of the path from the sense source electrode 19 to the drain electrode 10 through the SBD is lower in the semiconductor device 501 than in the semiconductor device 101. This enhances the effect of suppressing bipolar conduction in the p-n diode formed of each well region and the drift layer 2.

Compared to the semiconductor device 101 according to Embodiment 1, the semiconductor device 501 has the disadvantage of requiring an additional process to form the trench 41. However, as described with reference to FIG. 17, when a portion forming the MOSFET structure in the active sense region 61 is of a so-called trench-type, the trench may be formed at the same time as the trench 41. This substantially eliminates the disadvantage of the additional process. In addition, the trench-type is more advantageous because it allows lower on-resistance than a so-called planar-type, such as the type of the semiconductor device 101.

[Variations]

Figure 18:
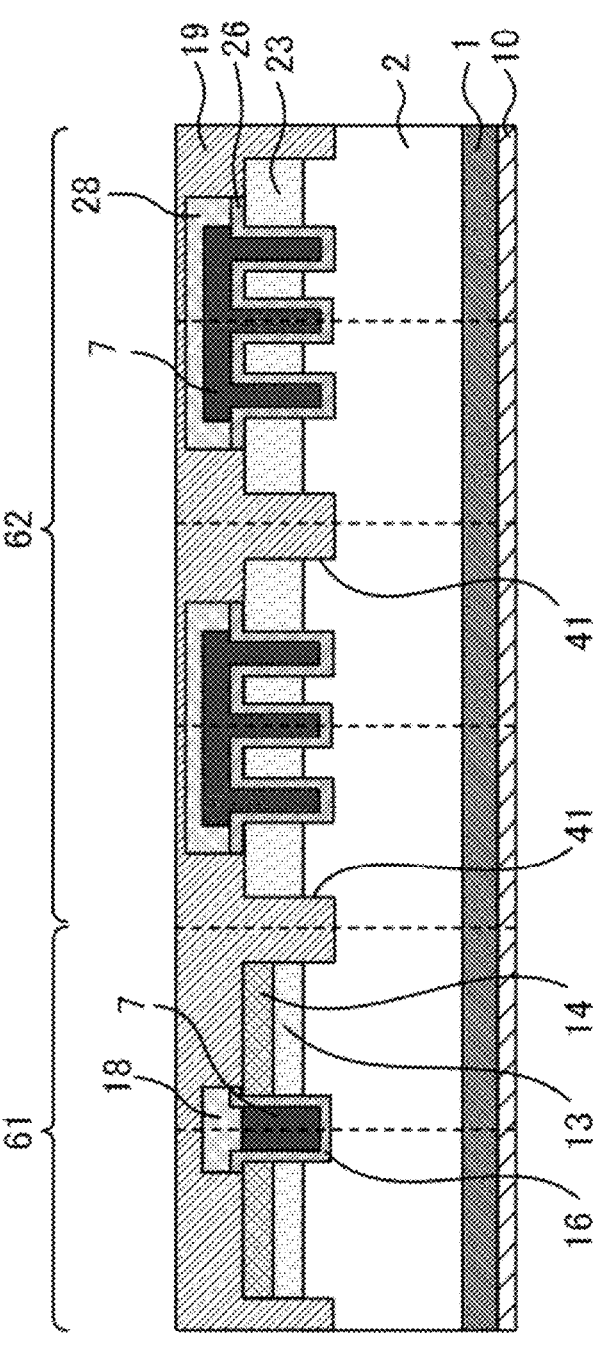
FIG. 18 is a schematic cross-sectional view of a sense region of a semiconductor device according to a variation of Embodiment 5.

Next, variations of the semiconductor device 501 according to Embodiment 5 will be described. FIG. 18 is a schematic cross-sectional view showing a cross-section of a part of the sense region 60 according to a variation of Embodiment 5. In the structure shown in FIG. 18, a dummy sense gate insulating film 26 and a gate electrode 7 in the dummy sense region 62 are provided in trenches (second trenches) extending from the surface of the semiconductor layer through a dummy sense well region 23 to the drift layer 2. The dummy sense gate insulating film 26 is in contact with the dummy sense well region 23 on the side surfaces of the trenches. The gate electrode 7 faces the dummy sense well region 23 via the dummy sense gate insulating film 26 on the side surfaces of the trenches. The other components are the same as those of the structure shown in FIG. 17.

In the structure shown in FIG. 18, not only the active sense region 61 but also the dummy sense region 62 has a trench-type structure. The trench-type gate structure in the dummy sense region 62 can be formed by using the same forming method as the trench-type gate structure in the active sense region 61 at the same time as or at different times from thereof.

The structure shown in FIG. 18 allows a capacitor between the sense source electrode 19 and the gate electrode 7 to be formed in a trench; thus, a capacitance per unit area is larger than that of the structure shown in FIG. 17.

Figure 19:
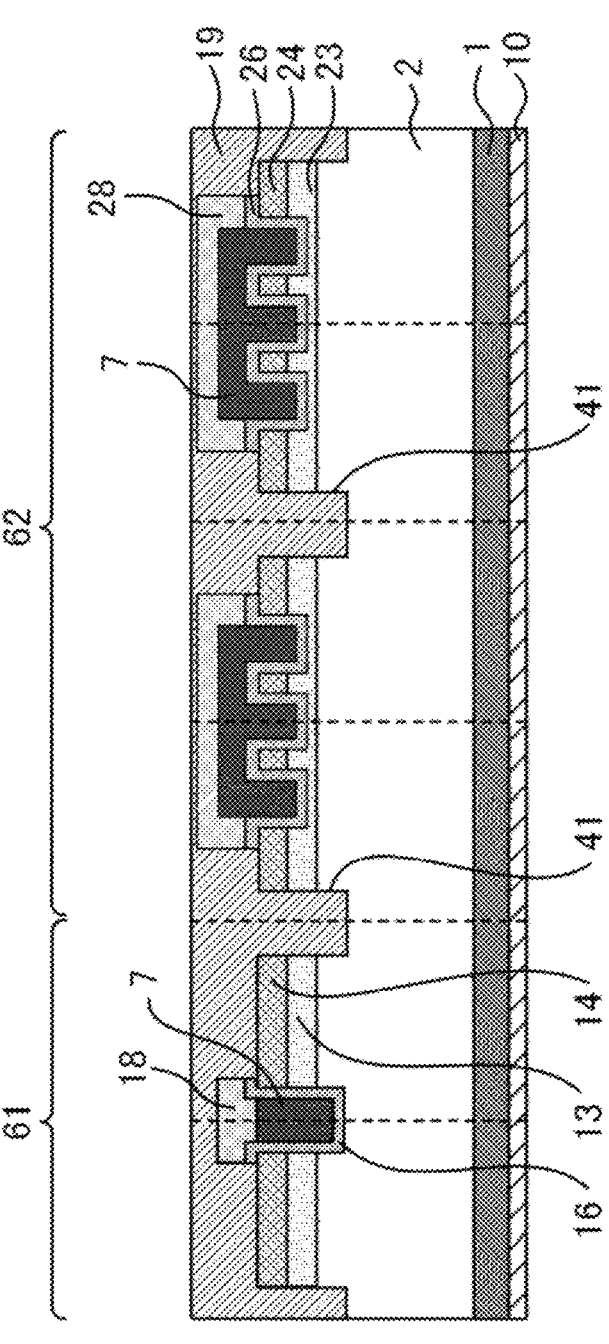
FIG. 19 is a schematic cross-sectional view of a sense region of a semiconductor device according to another variation of Embodiment 5.

FIG. 19 is a schematic cross-sectional view showing a cross-section of a part of the sense region 60 according to another variation of Embodiment 5. The structure shown in FIG. 19 includes an n-type dummy sense source region 24 that is similar to that described in Embodiment 2 and is formed in the dummy sense region 62, in addition to the structure shown in FIG. 18. The dummy sense source region 24 is selectively formed on the surface layer of the dummy sense well region 23, and is ohmically connected to the sense source electrode 19. The dummy sense region 62 has the dummy sense gate insulating film 26 and the gate electrode 7 provided in trenches (second trenches) extending from the surface of the semiconductor layer through the dummy sense source region 24 to the dummy sense well region 23.

In the structure shown in FIG. 19, the dummy sense source region 24 exists at a position facing the gate electrode 7 via the dummy sense gate insulating film 26 in a facing area FA; thus, a capacitance per unit area is larger than that of the structure shown in FIG. 18.

In the structure shown in FIG. 19, the depth of the trench having the dummy sense gate insulating film 26 and the gate electrode 7 formed therein is not more than the depth of the dummy sense well region 23 formed in the thickness direction of the drift layer 2. Thus, the dummy sense gate insulating film 26 is not in contact with the drift layer 2 at either the bottom surface or the side surface of the trench. This allows no forward current to flow through the dummy sense region 62 even if the dummy sense source region 24 is provided, preventing an increase in loss in the sense region 60.

In the above, as well as the structure in which the trench 41 is formed and the sense source electrode 19 is embedded therein, the trench-type gate structure in the active sense region 61 and the dummy sense region 62 are described; however, the structure is not limited thereto. For example, the structures described in Embodiment 1 to Embodiment 4 may employ the trench-type gate structure in one or both of the active sense region 61 and the dummy sense region 62 without employing a structure in which the trench 41 is formed. The main region 50 may employ a structure in which the trench is formed and the source electrode 9 is embedded therein, or employ the trench-type gate structure.

The trenches 41 or the unit cells including trench-type gate structures may be arranged in any shape, such as a stripe shape (comb shape) or a lattice shape.

Embodiment 6

In the present embodiment, the semiconductor device of any one of Embodiments 1 to 5 described above is applied to a power converter. The present disclosure is not limited to any particular power converter; however, a case where the present disclosure is applied to a three-phase inverter will be described as Embodiment 6.

Figure 20:
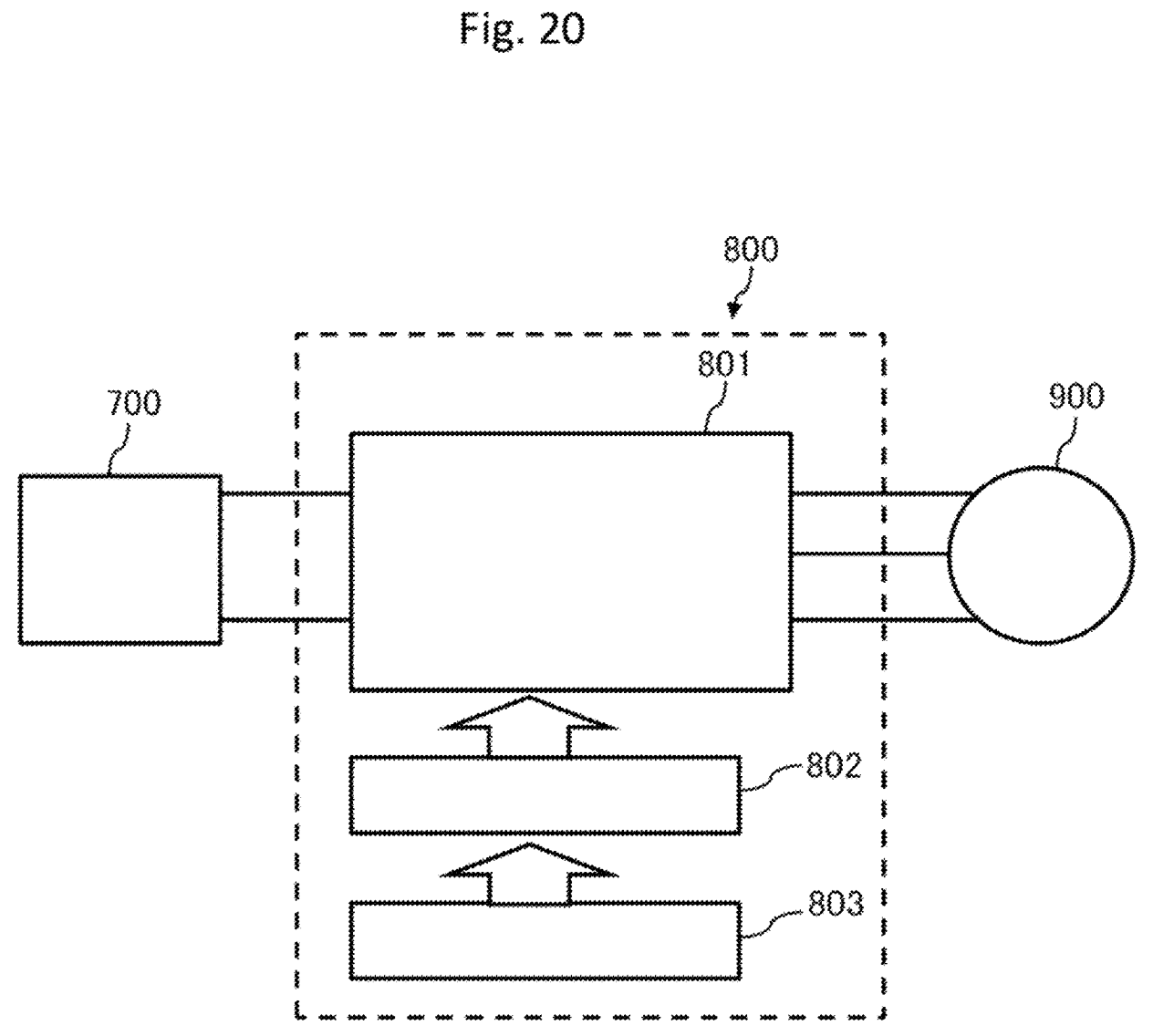

FIG. 20 is a block diagram showing a configuration of a power conversion system to which the power converter according to the present embodiment is applied.

The power conversion system shown in FIG. 20 includes a power supply 700, a power converter 800, and a load 900. The power supply 700 is a DC power supply and supplies DC power to the power converter 800. The power supply 700 can be constituted by various means, such as a DC system, a solar battery, a storage battery, or a rectifier circuit or an AC/DC converter connected to an AC system. The power supply 700 may be constituted by a DC/DC converter, which converts DC power outputted from a DC system into predetermined power.

The power converter 800, which is a three-phase inverter connected between the power supply 700 and the load 900, converts DC power supplied from the power supply 700 into AC power, and supplies the AC power to the load 900. As shown in FIG. 20, the power converter 800 includes a main conversion circuit 801 for converting an inputted DC power into AC power and outputting the AC power, a driving circuit 802 for outputting a driving signal for driving each switching device of the main conversion circuit 801, and a control circuit 803 for outputting a control signal for controlling the driving circuit 802 to the driving circuit 802.

The load 900 is a three-phase motor driven by the AC power supplied from the power converter 800. The load 900 is not for a specific application, but is an electric motor provided in various electric apparatuses; it is used as an electric motor for hybrid vehicles, electric vehicles, railroad vehicles, elevators, or air conditioners, for example.

The power converter 800 will be described in detail below. The main conversion circuit 801, which includes a switching device and a freewheel diode (not shown), converts DC power supplied from the power supply 700 into AC power by switching the switching device, and supplies the AC power to the load 900. There are various circuit configurations for implementing the main conversion circuit 801. The main conversion circuit 801 according to the present embodiment is a two-level three-phase full-bridge circuit that includes six switching devices and six freewheel diodes connected in anti-parallel to their respective switching devices. The semiconductor device according to any one of Embodiments 1 to 5 described above is applied to at least one of the switching devices or the freewheel diodes of the main conversion circuit 801. Among them, the MOSFET structures disposed in the main region 50 can be used as the switching devices, and the SBDs disposed in the main region 50 can be used as the freewheel diodes. The six switching devices are connected in series two by two to form upper-lower arms. The upper-lower arms constitute their respective phases (U-phase, V-phase, and W-phase) of the full-bridge circuit. Output terminals of the upper-lower arms, that is, three output terminals of the main conversion circuit 801 are connected to the load 900.

The semiconductor devices according to Embodiments 1 to 5 each have a structure in which the switching devices and the freewheel diodes are integrally included in one chip. Thus, by using the MOSFET structures disposed in the main region 50 as the switching devices and using the SBDs disposed in the main region 50 as the freewheel diodes in the main conversion circuit 801, the packaging area can be smaller as compared to a case of using two or more different chips each including either the switching devices or the freewheel diodes.

The driving circuit 802 generates driving signals for driving the switching devices of the main conversion circuit 801 and supplies the signals to the gate electrodes of the switching devices of the main conversion circuit 801. Specifically, a driving signal for turning on a switching device and a driving signal for turning off a switching device are outputted to a gate electrode of each switching device in accordance with a control signal from the control circuit 803 described later. The driving signal to keep a switching device in an ON state is a signal having a voltage higher than the threshold voltage of the switching device (ON signal). The driving signal to keep a switching device in an OFF state is a signal having a voltage lower than the threshold voltage of the switching device (OFF signal).

The control circuit 803 controls the switching devices of the main conversion circuit 801 so that the desired power is supplied to the load 900. Specifically, it calculates a time period during which each switching device of the main conversion circuit 801 should be in the ON state (ON time) on the basis of the power to be supplied to the load 900. For example, the main conversion circuit 801 can be controlled by PWM control that modulates the ON time of the switching device according to the voltage to be output. Then, a control command (control signal) is outputted to the driving circuit 802 at each time point in such a way that the ON signal is outputted to a switching device to be in the ON state and the OFF signal is outputted to a switching device to be in the OFF state. The driving circuit 802 outputs the ON signal or the OFF signal to the gate electrode of each switching device as a driving signal in accordance with the control signal.

In the power converter according to the present embodiment, the semiconductor device according to any one of Embodiments 1 to 5 is used as the switching device of the main conversion circuit 801. The use of such a highly reliable semiconductor device that suppresses bipolar degradation and capacitance reduction improves the reliability of the power converter.

The present embodiment exemplifies an application of the present disclosure to a two-level three-phase inverter, but this is not the limitation. The present disclosure may be applied to various power converters. The present embodiment exemplifies a two-level power converter, but it may be a three-level or multi-level power converter; when power is supplied to a single-phase load, the present disclosure may be applied to a single-phase inverter. The present disclosure may be applied to a DC/DC converter or an AC/DC converter when electric power is supplied to a load such as a DC load.

The power converter to which the present disclosure is applied is not limited to that for a load such as the above-described electric motor; for example, it may be used as a power supplying apparatus of an electrical discharge machine, a laser processing machine, an induction cooker, or a wireless power transmission system; it may be used as a power conditioner for a system such as a solar power system and a power storage system.

[Lastly]

In Embodiments 1 to 6 according to the present disclosure described above, silicon carbide is used as the semiconductor material, but other semiconductor materials may be used. That is, the semiconductor layer including the semiconductor substrate 1, the drift layer 2, each well region, and each source region may be formed of other semiconductor materials. Other semiconductor materials include a so-called wide-bandgap semiconductor having a bandgap wider than that of silicon, for example. Examples of wide-bandgap semiconductors other than silicon carbide include gallium nitride, aluminum nitride, aluminum gallium nitride, gallium oxide, and diamond. These wide-bandgap semiconductors also produce similar effects.

In the examples of the above-described embodiments, the SBD is provided in the main region 50 or the sense region 60, but this is not the limitation. Instead of providing the SBD, an n-type channel diode may be formed above a p-type well region so as to connect a source region and the drift layer. The impurity concentration and the thickness of the channel diode are designed in such a way that the channel diode operates as a unipolar diode at a gate voltage no more than a threshold voltage, and a turn-on voltage is lower than an operating voltage of a p-n diode configured by the p-type well region and the n-type drift layer. The channel diode functions as a unipolar type diode, which allows current to flow in only one direction, allowing no forward current but only a freewheel current to flow. Thus, even in the case of allowing reverse current to flow through the channel diode formed above the well region of the MOSFET during freewheel operation, the same effect can be produced as in the case of providing an SBD.

In each embodiment of the present description, material quality, materials, dimensions, shapes, relative disposed positions, conditions of implementation, or the like of components are described, but these are merely examples in all aspects and are not limited to those described in the embodiment. Therefore, innumerable variations that are not exemplified are envisioned within the scope of each embodiment. Such variations include modifications, addition, or omission of any component, as well as combinations of at least one extracted component in at least one embodiment with components of other embodiments.

The components described as being provided "one" in each embodiment described above may be provided "one or more" as long as no contradiction arises. Since each component is a conceptual unit, one component may be formed of a plurality of structures, or one component may correspond to a part of one structure.

None of the descriptions in the present specification are to be construed as an admission that this is conventional technology.

Each embodiment may be freely combined, and each embodiment may be modified or omitted as appropriate.

REFERENCE SIGNS LIST 1 semiconductor substrate
2 drift layer 3 well region
4 source region
5 Schottky junction
6 gate insulating film
7 gate electrodes
8 interlayer insulating film
9 source electrode
10 drain electrode
13 sense well region
14 sense source region
15 Schottky junction
16 sense gate insulating film
18 sense interlayer insulating film
19 sense source electrode
23 dummy sense well region
24 dummy sense source region
25 Schottky junction
26 dummy sense gate insulating film
28 dummy sense interlayer insulating film
31 inter-source-electrode region
33 boundary well region
35 Schottky junction
38 insulating film
41 trench
50 main region
60 sense region
61 active sense region
62 dummy sense region
70 boundary region
101 semiconductor device
201 semiconductor device
301 semiconductor device
401 semiconductor device
501 semiconductor device
700 power supply
800 power converter
801 main conversion circuit
802 driving circuit
803 control circuit
900 load

The invention claimed is:

1. A semiconductor device that includes a semiconductor layer having a first main surface and a second main surface opposite to the first main surface, a source electrode provided on a side of the first main surface, and a drain electrode provided on a side of the second main surface, and gate electrodes that control a current flowing between the source electrode and the drain electrode by a voltage applied to the gate electrodes, the semiconductor device comprising:

a sense source electrode provided separately from the source electrode and provided on the side of the first main surface of the semiconductor layer;

a drift layer of a first conductivity type forming a main portion of the semiconductor layer;

sense well regions of a second conductivity type selectively provided in a surface layer of the drift layer and electrically connected to the sense source electrode;

sense source regions of the first conductivity type each selectively provided in a surface layer of each of the sense well regions and electrically connected to the sense source electrode;

dummy sense well regions of the second conductivity type selectively provided in the surface layer of the drift layer separately from the sense well regions and electrically connected to the sense source electrode, and having no channel formed therein;

27 gate insulating films provided between the dummy sense well regions and the gate electrodes; and diodes provided between the sense source electrode and the drift layer, each having a turn-on voltage lower than an operating voltage of a p-n diode formed of each of the sense well regions and the drift layer or of each of the dummy sense well regions and the drift layer, and allowing a current to flow from the sense source electrode toward the drain electrode, wherein the diodes are provided in such a way that they are mixed with facing areas in a dummy sense region in which the dummy sense well regions and the diodes are disposed, the facing areas each being an area in which one of the dummy sense well regions faces one of the gate electrodes via one of the gate insulating films.

2. The semiconductor device according to claim 1, wherein the diodes and the facing areas are provided alternately and repeatedly in a planer view.

3. The semiconductor device according to claim 1, further comprising:

a sense region including the dummy sense region and an active sense region in which the sense well regions are disposed; and a main region that is a region different from the sense region, wherein the main region includes:

well regions of the second conductivity type selectively provided in the surface layer of the drift layer and electrically connected to the source electrode;

source regions of the first conductivity type each selectively provided in a surface layer of each of the well regions and electrically connected to the source electrode; and second diodes provided between the source electrode and the drift layer, each having a turn-on voltage lower than an operating voltage of a p-n diode formed of each of the well regions and the drift layer, and allowing a current to flow from the source electrode toward the drain electrode, wherein the diodes are disposed in the dummy sense region in such a way that an arrangement interval of the diodes is equal to or less than twice an arrangement interval of the second diodes in the main region.

4. The semiconductor device according to claim 1, wherein the diodes are disposed at intervals of 1 μm to 100 μm in the dummy sense region.

5. The semiconductor device according to claim 1, further comprising:

a sense region including the dummy sense region and an active sense region in which the sense well regions are disposed; and a boundary region that is a region different from the sense region and is provided on a periphery of the sense region, wherein the diodes and the facing areas are provided alternately and repeatedly from the boundary region toward the active sense region.

6. The semiconductor device according to claim 1, wherein the diodes are periodically provided in the dummy sense region.

7. The semiconductor device according to claim 1, wherein a distance between a p-n junction having a longest distance from one of the diodes and the one of the diodes is no more than a half of an arrangement interval of the diodes in the dummy sense region.

8. The semiconductor device according to claim 1, wherein, in each of the facing areas, no drift layer is provided at a position facing one of the gate electrodes via one of the gate insulating films.

9. The semiconductor device according to claim 8, further comprising dummy sense source regions of the first conductivity type selectively provided in surface layers of the dummy sense well regions, electrically connected to the sense source electrode, and each facing one of the gate electrodes via one of the gate insulating films.

10. The semiconductor device according to claim 9, wherein, in each of the facing areas, the dummy sense source regions are each provided at a position facing one of the gate electrodes via one of the gate insulating films, and the dummy sense well regions are not in contact with the gate insulating films.

11. The semiconductor device according to claim 1, wherein the sense well regions are provided in one block in a plan view.

12. The semiconductor device according to claim 1, wherein the dummy sense well regions are not ohmically connected to the source electrode.

13. The semiconductor device according to claim 1, further comprising a boundary well region of the second conductivity type provided in the surface layer of the drift layer between the source electrode and the sense source electrode, wherein the boundary well region is not ohmically connected to either the source electrode or the sense source electrode, and is not physically connected to either the sense well regions or the dummy sense well regions.

14. The semiconductor device according to claim 13, wherein the boundary well region is Schottky-connected to the source electrode and the sense source electrode.

15. The semiconductor device according to claim 13, further comprising an insulating film formed between the boundary well region and the source electrode and between the boundary well region and the sense source electrode.

16. The semiconductor device according to claim 1, wherein the sense source electrode is provided in first trenches extending through the dummy sense well regions to the drift layer, and the diodes are each formed in a portion where the sense source electrode and the drift layer face each other on a bottom surface or a side surface of each of the first trenches.

17. The semiconductor device according to claim 1, wherein the gate insulating films and the gate electrodes are provided in second trenches extending from a surface of the semiconductor layer to the dummy sense well regions, and the gate electrodes each face one of the dummy sense well regions via one of the gate insulating films on at least one of a bottom surface or a side surface of each of the second trenches.

18. The semiconductor device according to claim 17, wherein a depth of each of the second trenches is equal to or less than a depth of each of the dummy sense well regions in a thickness direction of the drift layer.

19. The semiconductor device according to claim 17, comprising dummy sense source regions of the first conductivity type provided in surface layers of the dummy sense well regions and electrically connected to the sense source electrode, wherein the gate insulating films and the gate electrodes are provided in the second trenches extending through the dummy sense source regions to the dummy sense well regions, the gate insulating films are not in contact with the drift layer at either bottom surfaces or side surfaces of the second trenches, and the gate electrodes face the dummy sense source regions via the gate insulating films.

20. The semiconductor device according to claim 1, wherein the diodes are each formed of a Schottky junction where the sense source electrode and the drift layer are in Schottky contact with each other.

21. The semiconductor device according to claim 1, wherein the diodes are each formed of a channel diode of the first conductivity type formed above each of the dummy sense well regions.

22. The semiconductor device according to claim 1, wherein a semiconductor material of the semiconductor layer is a wide-bandgap semiconductor.

23. A semiconductor device comprising:

a semiconductor layer having a drift layer of a first conductivity type;

a main region having MOSFET structures each including a source electrode and a gate electrode provided on a side of one main surface of the semiconductor layer, and a drain electrode provided on a side of another main surface of the semiconductor layer;

a sense region that is a region different from the main region and has MOSFET structures each including a sense source electrode formed on the side of the one main surface of the semiconductor layer separately from the source electrode;

dummy sense well regions of a second conductivity type selectively provided in a surface layer of the drift layer in the sense region, and having no channel formed therein;

gate insulating films provided between the dummy sense well regions and the gate electrodes; and diodes formed between the sense source electrode and the drift layer, each having a turn-on voltage lower than an operating voltage of a p-n diode formed of each of the dummy sense well regions and the drift layer, and allowing a current to flow from the sense source electrode toward the drain electrode, wherein the diodes are provided in such a way that they are mixed with facing areas in the sense region, the facing areas each being an area in which one of the dummy sense well regions faces one of the gate electrodes via one of the gate insulating films.

24. A power converter comprising:

a main conversion circuit that includes the semiconductor device according to claim 1, converts inputted power, and outputs converted power;

a driving circuit to output a driving signal for driving the semiconductor device to the semiconductor device; and a control circuit to output a control signal for controlling the driving circuit to the driving circuit.

* * * * *